United States Patent
Jeon et al.

(10) Patent No.: US 9,819,223 B2
(45) Date of Patent: Nov. 14, 2017

(54) POWER SUPPLY DEVICE AND POWER SUPPLY METHOD USING THE SAME

(71) Applicant: Samsung Electronics Co., Ltd., Suwon-si (KR)

(72) Inventors: Sang Hun Jeon, Suwon-si (KR); Ho-Jin Chun, Seoul (KR)

(73) Assignee: Samsung Electronics Co., Ltd. (KR)

( * ) Notice: Subject to any disclaimer, the term of this patent is extended or adjusted under 35 U.S.C. 154(b) by 459 days.

(21) Appl. No.: 14/509,755

(22) Filed: Oct. 8, 2014

(65) Prior Publication Data
US 2015/0130533 A1     May 14, 2015

(30) Foreign Application Priority Data
Nov. 11, 2013   (KR) .................. 10-2013-0136406

(51) Int. Cl.
| | |
|---|---|
| *H02H 7/00* | (2006.01) |
| *H02J 9/06* | (2006.01) |
| *H02J 7/00* | (2006.01) |
| *G11C 5/14* | (2006.01) |
| *G06F 1/26* | (2006.01) |
| *H02M 1/32* | (2007.01) |
| *H02H 7/122* | (2006.01) |
| *H02M 3/158* | (2006.01) |

(52) U.S. Cl.
CPC .............. *H02J 9/061* (2013.01); *G11C 5/147* (2013.01); *H02J 7/007* (2013.01); *G06F 1/26* (2013.01); *H02H 7/1222* (2013.01); *H02M 1/32* (2013.01); *H02M 3/1584* (2013.01)

(58) Field of Classification Search
USPC ......................................................... 361/18
See application file for complete search history.

(56) References Cited

U.S. PATENT DOCUMENTS

| | | | |
|---|---|---|---|
| 7,751,259 B2 | 7/2010 | Nakamura et al. | |
| 7,855,930 B2 | 12/2010 | Chen | |
| 7,986,557 B2 | 7/2011 | Tokiwa et al. | |
| 8,189,404 B2 | 5/2012 | Huang et al. | |
| 8,248,881 B2 | 8/2012 | Roohparvar | |
| 8,300,471 B2 | 10/2012 | Kim et al. | |
| 2009/0274000 A1 | 11/2009 | Pekny et al. | |
| 2010/0124140 A1 | 5/2010 | Otsuka et al. | |
| 2012/0099392 A1 | 4/2012 | Shim et al. | |

(Continued)

OTHER PUBLICATIONS

Intel Corporation et al., "Open NAND Flash Interface Specification", Revision 3.1, Sep. 19, 2012, 296 pages.

*Primary Examiner* — Danny Nguyen
(74) *Attorney, Agent, or Firm* — Ward and Smith, P.A.

(57) ABSTRACT

A power supply for supplying power to a chipset includes a first voltage regulating circuit, which is configured to convert an applied power supply signal into a group of first supply voltages, and a second voltage regulating circuit, which is configured to convert the applied power supply signal into a group of second supply voltages. A control circuit is provided, which is configured to selectively enable the second voltage regulating circuit to generate the group of second supply voltages. An output discharge circuit is provided, which is configured to discharge an output stage of the first voltage regulating circuit in response to a transition of the first voltage regulating circuit from an active state to an inactive state. This transition of the first voltage regulating circuit from an active state to an inactive state can occur in response to a change in magnitude of the power supply signal.

19 Claims, 17 Drawing Sheets

(56) References Cited

U.S. PATENT DOCUMENTS

2012/0102310 A1  4/2012  Shim et al.
2012/0275226 A1  11/2012  Nakamura et al.
2013/0207695 A1  8/2013  Jeon et al.

POWER SUPPLY DEVICE AND POWER SUPPLY METHOD USING THE SAME

REFERENCE TO PRIORITY APPLICATION

This U.S. non-provisional patent application claims priority under 35 U.S.C. §119 to Korean Patent Application No. 10-2013-0136406, filed Nov. 11, 2013, the entire contents of which are hereby incorporated herein by reference.

FIELD

The present inventive concept herein relates to power supply devices, and more particularly, to a power supply device having a function of controlling a power supply order and method for supplying power using the same.

BACKGROUND

A semiconductor device is supplied with power that needs for its operation from the outside. For example, a semiconductor memory device is supplied with power that needs for a memory cell array from the outside to perform read and write operations of data.

Chipset internal blocks of a semiconductor device require different power supply voltages respectively. Thus, a power supply circuit for supplying power to a semiconductor device converts an external voltage into at least one supply voltage to supply it to internal blocks of a semiconductor device. For example, a power supply circuit can be supplied with an external voltage and a ground voltage from the outside and then convert the external voltage and the ground voltage into a supply voltage such as a reference voltage, a peripheral voltage and a bulk voltage to supply it to internal blocks of a semiconductor device. To protect internal blocks from sudden power supply and sudden power interruption, a stable power supply technique is required.

SUMMARY

Embodiments of the inventive concept provide a power supply device for supplying power to a chipset of a semiconductor device. The power supply device may include a pre-control voltage regulate unit (i.e., circuit) configured to convert main power into a pre-control supply voltage group including at least one pre-control supply voltage and to provide the pre-control supply voltage group to the chipset in response to the main power. A post-control voltage regulate unit is provided, which is configured to convert the main power into a post-control supply voltage group including at least one post-control supply voltage and to provide the post-control supply voltage group to the chipset in response to the main power. A control unit is provided, which is configured to provide a command activating the post-control supply voltage group to the chipset so that the chipset uses the post-control voltage supply group An output discharge unit is configured to discharge remaining charges at an output stage of the pre-control voltage regulate unit when the pre-control voltage regulate unit is in an inactivate state in response to a level of the main power.

Embodiments of the inventive concept also provide a method for supplying power to a chipset of a semiconductor device. The method may include: (i) applying a main power to a power supply device, (ii) converting the main power into at least one pre-control supply voltage and at least one post-control supply voltage and providing the at least one post-control supply voltage to the chipset, (iii) discharging remaining charges of the power supply device for a pre-designated delay time, (iv) providing the at least one pre-control supply voltage to the chipset after the delay time has passed, (v) and activating the at least one post-control supply voltage in the chipset in response to a command provided from the power supply device.

Embodiments of the inventive concept also provide a method for supplying a pre-control voltage and a post-control voltage to a chipset of a semiconductor device using a power supply device. The method may include storing preliminary power from main power, interrupting the main power from the power supply device, dumping data being used in the power supply device using the preliminary power as an operating voltage, providing a command inactivating the post-control supply voltage to the chipset, stopping an output of the pre-control supply voltage from the power supply device in response to a level reduction of the preliminary power, and discharging remaining charges of the power supply device using the preliminary power as an operating voltage.

BRIEF DESCRIPTION OF THE FIGURES

Preferred embodiments of the inventive concept will be described below in more detail with reference to the accompanying drawings. The embodiments of the inventive concept may, however, be embodied in different forms and should not be constructed as limited to the embodiments set forth herein. Rather, these embodiments are provided so that this disclosure will be thorough and complete, and will fully convey the scope of the inventive concept to those skilled in the art. Like numbers refer to like elements throughout.

DETAILED DESCRIPTION OF PREFERRED EMBODIMENTS

Figure 1:
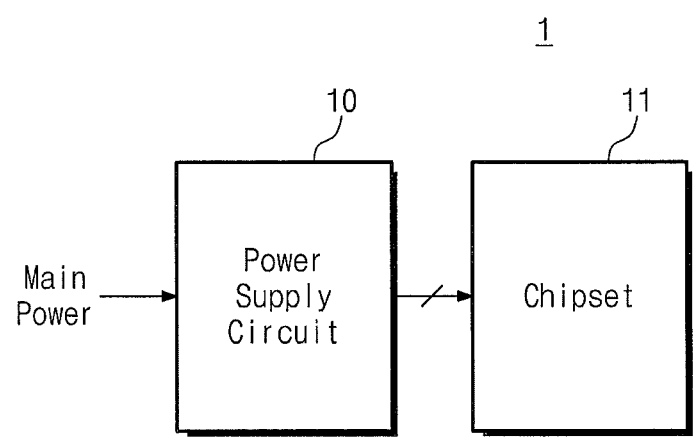
FIG. 1 is a block diagram illustrating a nonvolatile memory system in accordance with exemplary embodiments of the inventive concept.

Embodiments of inventive concepts will be described more fully hereinafter with reference to the accompanying drawings, in which embodiments of the invention are shown. This inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art. In the drawings, the size and relative sizes of layers and regions may be exaggerated for clarity. Like numbers refer to like elements throughout.

FIG. 1 is a block diagram illustrating a nonvolatile memory system in accordance with exemplary embodiments of the inventive concept. Referring to FIG. 1, the memory system 1 includes a power supply circuit 10 and a chipset 11. The power supply circuit 10 is connected to a main power. The power supply circuit 10 is supplied with the whole power required for an operation of the memory system 1 from the main power. The power supply circuit 10 provides a supply voltage to the chip set 1 using the main power. The chipset 11 stores data. The chipset 11 may be a nonvolatile memory including a NAND. Internal elements of the chipset 11 can require a plurality of supply voltages having different levels respectively. The power supply circuit 10 can convert the main power into a plurality of supply voltages and can provide the converted supply voltages to the chipset 11.

The power supply circuit 10 generates a plurality of supply voltages in response to an increase of a voltage level of the main power and can supply the generated supply voltages to the chipset 11 according to the pre-designated order. The power supply circuit 10 can perform the operation described above using hardware.

The power supply circuit 10 can force charges which remain in the power supply circuit 10 to be discharged using hardware before a voltage is supplied to the chipset 11 or when a voltage being supplied to the chipset 11 is interrupted. That is, the power supply circuit 10 can control the order that a voltage is supplied to the chipset 11 and a voltage being supplied to the chipset 11 is interrupted in hardware and can prevent damage and malfunction of internal elements of the chipset 11 that may be caused by sudden current supply and sudden current breaking in hardware through a discharge operation. Voltage supply and voltage interruption of the power supply circuit 10 are described in detail with reference to drawings below.

Figure 2:
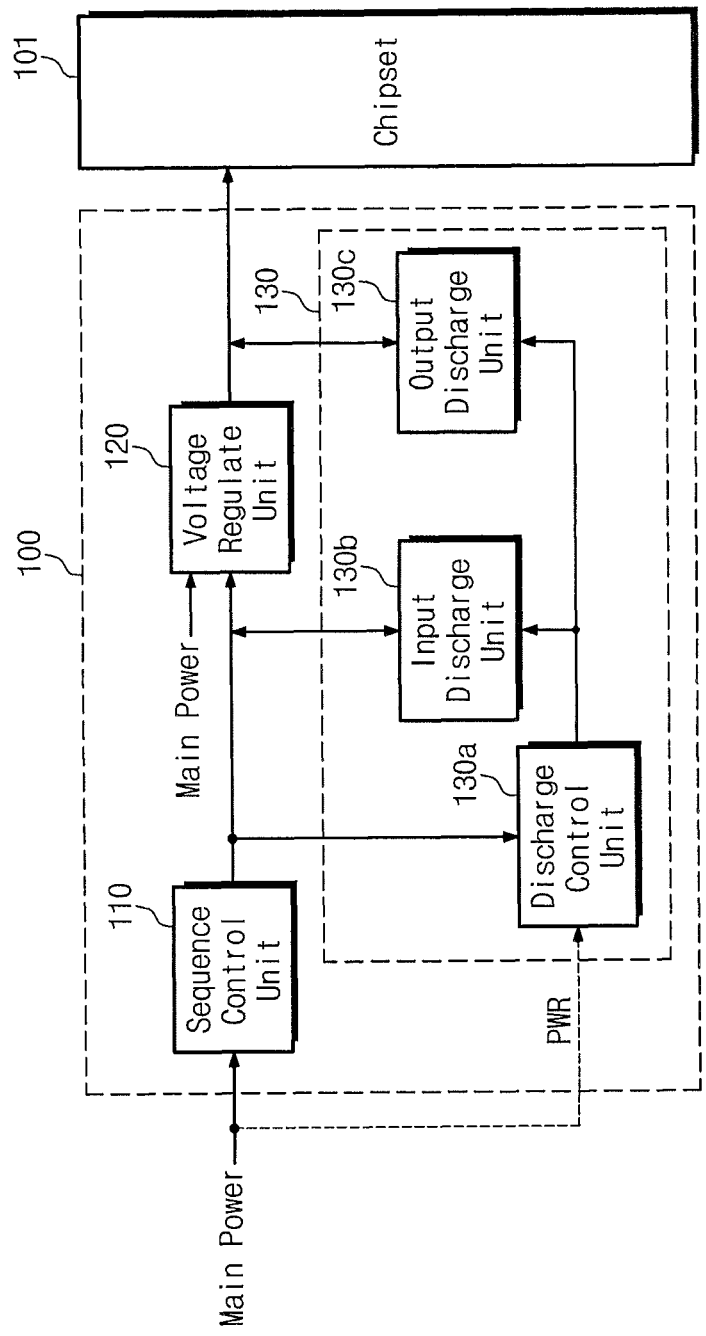
FIG. 2 is a block diagram illustrating an embodiment of a memory system of FIG. 1.

FIG. 2 is a block diagram illustrating an embodiment of a memory system 1 of FIG. 1. Referring to FIG. 2, a power supply circuit 100 includes a sequence control unit 110, a voltage regulate unit 120, and an enforced discharge unit 130.

The sequence control unit 110 controls an operation of the voltage regulate unit 120 using an enable signal. The sequence control unit 110 can control an applying order of voltages being supplied to a chipset 101 using the voltage regulate unit 120.

The sequence control unit 110 detects a voltage level of main power input from the outside. The sequence control unit 110 generates a detecting signal when the main power reaches the pre-designated voltage detection level. The sequence control unit 110 delays the generated detecting signal during a predetermined delay time and then outputs the delayed detecting signal as an enable signal EN.

The number of detecting signals may be one or more which are generated in response to a voltage level of the main power being detected by the sequence control unit 110. Delay times corresponding to different detecting signals generated may be different from one another. The sequence control unit 110 outputs signals delayed for different delay times according to a level of the main power as an enable signal EN using a plurality of detecting signals and a plurality of delay times generated in respond to the detecting signals.

The voltage regulating unit 120 converts the main power into a plurality of supply voltages having different levels from one another. The voltage regulating unit 120 includes at least one voltage regulator. The voltage regulating unit 120 receives main power and an enable signal input. Each voltage regulator, if an enable signal is input, converts the main power input into a supply voltage having the pre-designated voltage level to output it.

The enforced discharge unit 130 forcibly generates a discharge current to discharge charges. The enforced discharge unit 130 discharges charges which remain in a capacitor of the power supply circuit 100 before a voltage is supplied to the chipset 101. The enforced discharge unit 130 discharges charges that remain in the power supply circuit 100 when power is interrupted.

The enforced discharge unit 130 includes a discharge control unit 130a, an input discharge unit 130b and an output discharge unit 130c.

The discharge control unit 130a controls the input discharge unit 130b and the output discharge unit 130c in response to an enable signal input from the sequence control unit 110. For example, the discharge control unit 130a, if the enable signal input from the sequence control unit 110 is a low level signal, can generate a discharge signal so that remaining charges are discharged in the input discharge unit 130b and the output discharge unit 130c. The discharge control unit 130a can transmit the generated discharge signal to the input and output discharge units 130b and 130c.

The discharge control unit 130a performs an operation complementary to the voltage regulate unit 120. For example, unlike the discharge control unit 130a, the voltage regulate unit 120, if the enable signal input from the sequence control unit 110 is a low level signal, may be in a no-operation state. The voltage regulate unit 120, if the enable signal input from the sequence control unit 110 is a high level signal, may be in a state of outputting a supply voltage. The discharge control unit 130a can control the input discharge unit 130b and the output discharge unit 130c so that remaining charges are discharged when the voltage regulate unit 120 is in a no-operation state and a discharge operation with respect to remaining charges is stopped when the voltage regulate unit 120 is in an operation state.

The input discharge unit 130b discharges charges that remain at an input stage of the voltage regulate unit 120. The input discharge unit 130b can be constituted by a resistor and a semiconductor switch. As described above, a discharge operation of the output discharge unit 130c is controlled through a discharge signal input from the discharge control unit 130a.

The quantity of discharge currents being discharged through the enforced discharge unit 130 may vary. A discharge speed and time of remaining charges can be controlled through a control of the discharge current amount.

The quantity of discharge currents of each block being discharged by the enforced discharge unit 130 may vary. For example, the enforced discharge unit 130 can control the quantity of discharge currents of each block so that the quantity of discharge currents of a block supplying a high supply voltage is larger than the quantity of discharge currents of a block supplying a low supply voltage. This can make the enforced discharge unit 130 complete a discharge operation in the pre-designated order.

As described above, the power supply circuit 100 can supply voltages having a plurality of levels to the chipset 101 in the pre-designated order. The power supply circuit 100 can forcibly discharge charges that remain in the power supply circuit 100 using the enforced discharge unit 130 before power is supplied to the chipset 101 or when power being supplied to the chipset 101 is interrupted. The power supply circuit 100 can control the order that a voltage is supplied and interrupted to prevent damage and malfunction of chipset internal elements that may be caused by sudden current supply and sudden current interruption.

Figure 3:
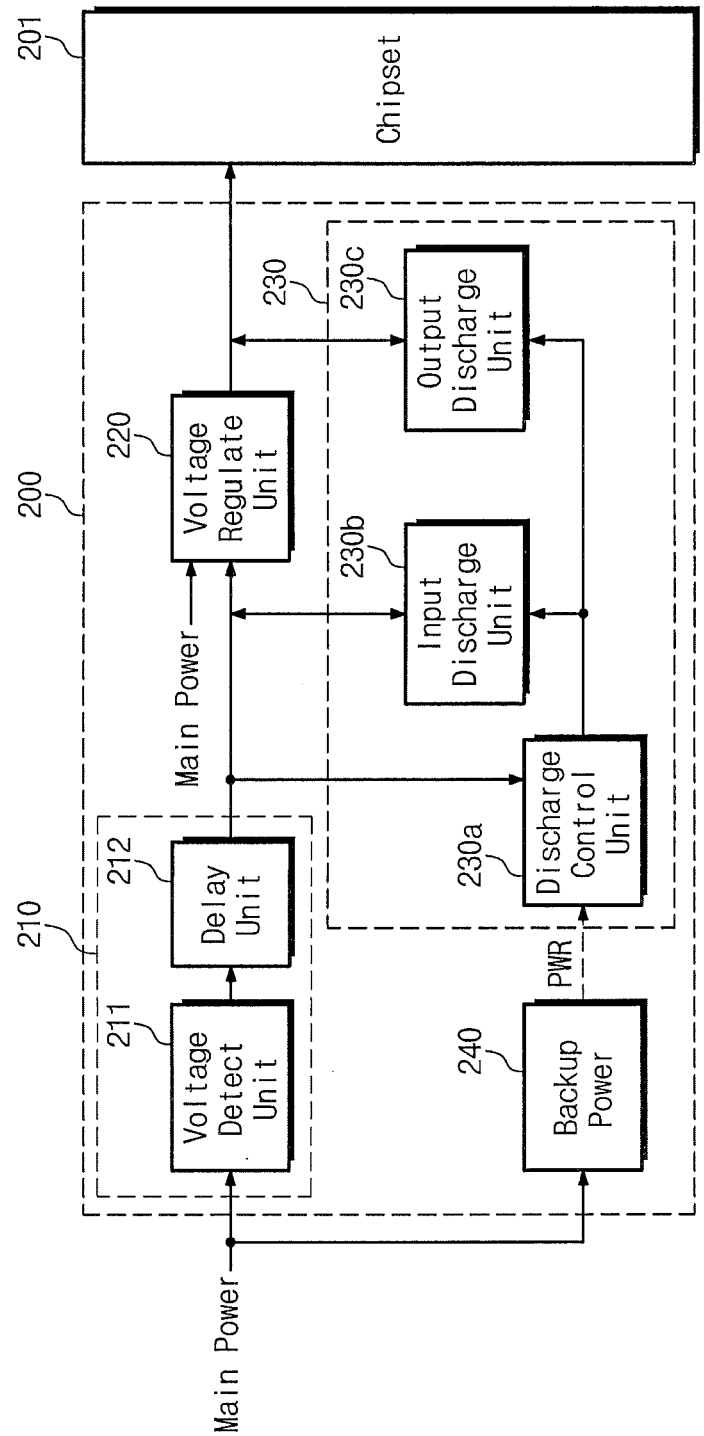
FIG. 3 is a block diagram illustrating another embodiment of a memory system of FIG. 1.

FIG. 3 is a block diagram illustrating another embodiment of a memory system of FIG. 1. Referring to FIG. 3, a power supply circuit 200 includes a sequence control unit 210, a voltage regulate unit 220, an enforced discharge unit 230, and a backup power unit 240. The voltage regulate unit 220 and the enforced discharge unit 230 of the power supply circuit 200 of FIG. 3 may have the same constitution and operation principle as the voltage regulate unit 120 and the enforced discharge unit 130 of the power supply circuit 100 of FIG. 2.

The sequence control unit 210 includes a voltage detect unit 211 and a delay unit 212. The voltage detect unit 211 is connected to main power to detect a voltage level of the main power. The voltage detect unit 211 includes at least one voltage detector for detecting a voltage level of the main power. The voltage detect unit 211 outputs a detecting signal when the main power reaches the pre-designated voltage detecting level. The detecting signal may be a high level signal. Voltage detecting levels may be different from one another which are required in order for a plurality of voltage detectors included in the voltage detect unit 211 to output a detecting signal.

The delay unit 212 is connected to the voltage detect unit 211. The delay unit 212 delays an output of the voltage detect unit 211 for the pre-designated delay time to output the delayed output of the voltage detect unit 211. The delay unit 212 includes at least one delayer. Each delayer is connected to a corresponding voltage detector to delay an output of the voltage detector for a predetermined delay time. Delay times of the plurality of delayers included in the delay unit 212 may be different from one another.

The backup power unit 240 stores power input from the main power. The backup power unit 240 supplies the power stored to the enforced discharge unit 230 when the main power is interrupted. This makes the enforced discharge unit 230 operate during time that the backup power unit 240 is discharged even when the main power is interrupted.

Since the enforced discharge unit 230 of the power supply circuit 200 can stably operate even when the main power is interrupted, charges that remain in the power supply circuit 200 can be stably discharged even when power is interrupted. Thus, the power supply circuit 200 can more stably control the order that a voltage is supplied and interrupted compared with the power supply circuit 100. The power supply circuit 200 prevents damage of internal elements of a chipset that may be caused by a sudden current supply and sudden current interruption using the operation described above.

Figure 4:
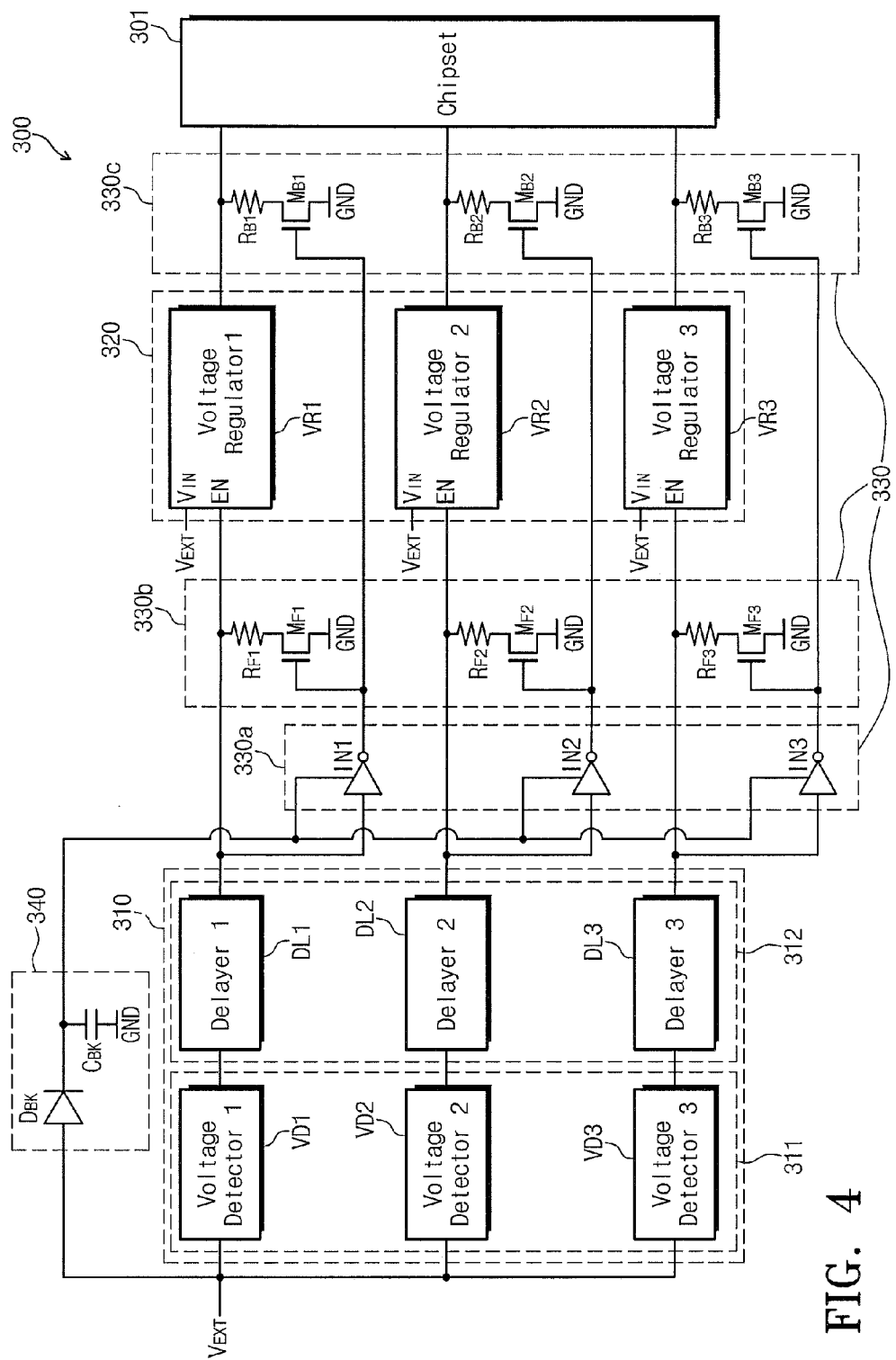
FIG. 4 is a drawing illustrating an embodiment of a memory system of FIG. 3.

FIG. 4 is a drawing illustrating an embodiment of a memory system of FIG. 3. Referring to FIG. 4, a power supply circuit 300 includes a sequence control unit 310, a voltage regulate unit 320, an enforced discharge unit 330 and the backup power unit 340.

The sequence control unit 310 includes a voltage detect unit 311 and a delay unit 312. The voltage detect unit 311 includes a first voltage detector VD1, a second voltage detector VD2 and a third voltage detector VD3. The delay unit 312 includes a first delayer DL1, a second delayer DL2 and a third delayer DL3. However, this is only an illustration and the number of voltage detectors and delayers is not limited. The inventive concept can be applied to all power supply circuits having at least two voltage detectors and delayers.

When main power $V_{EXT}$ reaches the pre-designated voltage level, the voltage detectors VD1~VD3 output a detecting signal. The detecting signal which the voltage detectors VD1~VD3 output is a high level output signal. It is assumed that a voltage detecting level V1 of the first voltage detector VD1, a voltage detecting level V2 of the second voltage detector VD2 and a voltage detecting level V3 of the third voltage detector VD3 have a relation of V1<V2<V3.

When the main power $V_{EXT}$ is supplied to the power supply circuit 300, a voltage level of the main power $V_{EXT}$ sequentially reaches V1, V2 and V3. Thus, a high level signal is output in the order of the first voltage detector VD1, the second voltage detector VD2 and the third voltage detector VD3.

When a signal of a high level is input, the delayers DL1~DL3 delay the inputted signal for the pre-designated time and then output the delayed signal. It is assumed that a delay time TD1 of the first delayer DL1, a delay time TD2 of the second delayer DL2 and a delay time TD3 of the third delayer DL3 have a relation of TD1<TD2<TD3. If a level of a signal being input is changed from a high level to a low level, the delayers DL1~DL3 immediately output the low level signal without delay of the signal.

If a high level signal is output in the order of the first voltage detector VD1, the second voltage detector VD2 and the third voltage detector VD3, the signals outputted are input to the first delayer DL1, the second delayer DL2 and the third delayer DL3 respectively to be delayed and then output. Thus, times that signals are output from the delayers depend on times that voltage detectors connected to respective delayers detect the main power $V_{EXT}$ and respective delay times of the delayers.

The voltage regulate unit 320 includes a first voltage regulator VR1, a second voltage regulator VR2 and a third voltage regulator VR3. However, this is only an illustration and the number of voltage regulators of the inventive concept is not limited. For example, the inventive concept can be applied to all power supply circuits having at least two voltage regulators.

The voltage regulators VR1~VR3 are inputted with power $V_{IN}$ and an enable signal EN. If the enable signal EN is input, each voltage regulator converts the inputted main power $V_{EXT}$ into the pre-designated voltage level and then output the converted pre-designated voltage level.

The voltage regulators VR1~VR3 are inputted with the main power $V_{EXT}$ as the power $V_{IN}$. An input stage of the enable signal EN is connected to an output stage of the delay unit 312. Thus, whether or not a voltage of each voltage regulator is output is determined by whether or not the main power $V_{EXT}$ is applied and an output voltage level of the delayer connected to each voltage regulator.

The enforced discharge unit 330 includes a discharge control unit 330a, an input discharge unit 330b and an output discharge unit 330c. The enforced discharge unit 330 discharges charges that remain at input and output stages of the voltage regulate unit 320 in response to an enable signal output from the sequence control unit 310.

The discharge control unit 330a controls operations of the input discharge unit 330b and the output discharge unit 330c in response to an enable signal output from the sequence control unit 310. The discharge control unit 330a includes a first inverter IN1, a second inverter IN2 and a third inverter IN3.

The input discharge unit 330b is connected to an input stage of the voltage regulate unit 320. The input discharge unit 330b forcibly generates a current between an input stage of the voltage regulate unit 320 and a ground to discharge remaining charges. The input discharge unit 330b includes first, second and third input resistors $R_{F1}$, $R_{F2}$ and $R_{F3}$ and first, second and third input switches $M_{F1}$, $M_{F2}$ and $M_{F3}$.

The output discharge unit 330c is connected to an output stage of the voltage regulate unit 320. The output discharge unit 330c forcibly generates a current between an output stage of the voltage regulate unit 320 and a ground to discharge remaining charges. The output discharge unit 330c includes first, second and third output resistors $R_{B1}$, $R_{B2}$ and $R_{B3}$ and first, second and third output switches $M_{B1}$, $M_{B2}$ and $M_{B3}$. A discharge operation through the enforced discharge unit 330 of the power supply circuit 300 will be described in detail later.

The backup power unit 340 stores power supplied from the main power $V_{EXT}$. The backup power unit 340 includes a backup diode $D_{BK}$ and a backup capacitor $C_{BK}$. The backup power unit 340 supplies power stored in the backup capacitor $C_{BK}$ to the discharge control unit 330a as a supply voltage through the backup diode $D_{BK}$. Thus, even when the main power $V_{EXT}$ is interrupted, the discharge control unit 330a can operate until power stored in the backup power unit 340 is consumed.

Figure 5:
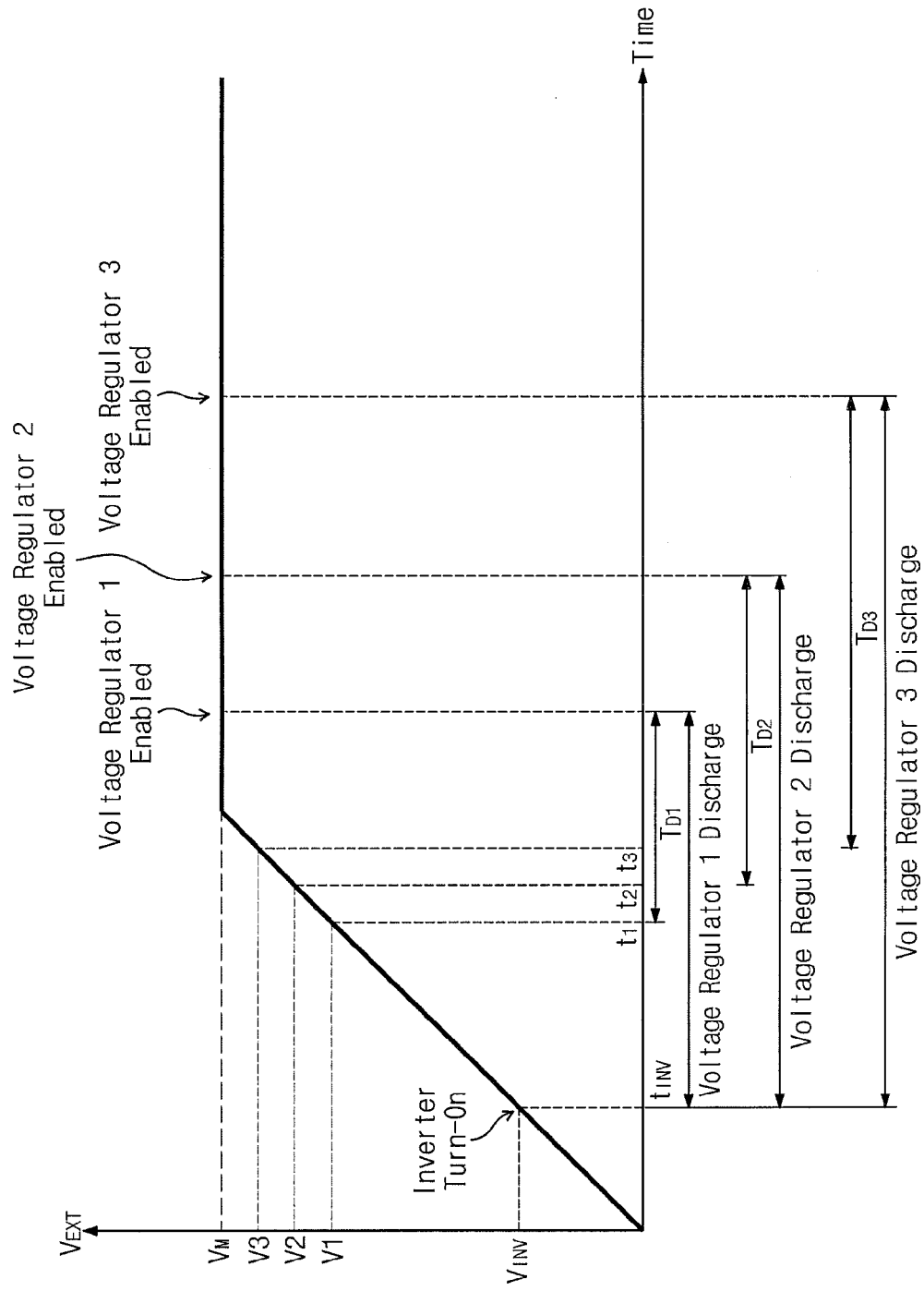
FIG. 5 is a graph showing an electric charge discharge operation relative to time when a main power is applied to a power supply circuit in accordance with exemplary embodiments of the inventive concept.

A discharge operation of the power supply circuit 300 is described in detail with reference to FIGS. 5 and 6. FIG. 5 is a graph showing an electric charge discharge operation relative to time when the main power $V_{EXT}$ is applied to the power supply circuit 300. Referring to FIG. 5, the main power $V_{EXT}$ being applied to the power supply circuit 300 reaches an inverter supply voltage $V_{INV}$ first. The inverter supply voltage $V_{INV}$ is a supply voltage of inverters included in the discharge control unit 330a (refer to FIG. 4). Since the main power $V_{EXT}$ does not reach yet a voltage detecting level of the sequence control unit 310 when the main power $V_{EXT}$ reaches the inverter supply voltage $V_{INV}$, an output of the sequence control unit 310 is in a low state. In this case, a high level signal is output from the discharge control unit 330a.

Further referring to FIG. 4, an output stage of the discharge control unit 330a is connected to gates of switches of the input discharge unit 330b and the output discharge unit 330c. As a high level output signal of the discharge control unit 330a is inputs to the gates of the switches of the input discharge unit 330b and the output discharge unit 330c, the first, second and third input switches $M_{F1}$, $M_{F2}$ and $M_{F3}$ and the first, second and third output switches $M_{B1}$, $M_{B2}$ and $M_{B3}$ are turned on. Thus, charges that remain at an input stage of the voltage regulate unit 320 are discharged by the input discharge unit 330b and charges that remain at an output stage of the voltage regulate unit 320 are discharged by the output discharge unit 330c.

A speed at which charges are discharged in the input discharge unit 330b and the output discharge unit 330c depends on the quantity of currents flowing through the switches of the input discharge unit 330b and the output discharge unit 330c. The quantity of currents flowing through the switches is determined by a characteristic of each switch and resistance values of the resistors connected to the switches. Thus, in the case that same switches are used, a discharge speed with respect to each block can be changed by controlling resistance values of the input resistors $R_{F1}$~$R_{F3}$ and the output resistors $R_{B1}$~$R_{B3}$.

Further referring to FIG. 5, if a level of the main power $V_{EXT}$ continues to increase, the level of the main power $V_{EXT}$ reaches a voltage detecting level V1 of the first voltage detector 1. The first voltage detector VD1 outputs a high level signal from when the main power $V_{EXT}$ reaches the voltage detecting level V1 of the first voltage detector 1 (t1).

The first delayer DL1 delays a high level output signal outputted from the first voltage detector VD1. The first delayer DL1 in a low level signal output state outputs a high level signal after a delay time $T_{D1}$ from when the main power $V_{EXT}$ reaches the voltage detecting level V1 of the first voltage detector VD1 (t1).

The high level signal outputted from the first delayer DL1 becomes an input of the enable signal EN of the first voltage regulator VR1. The first voltage regulator VR1 becomes an enable state in response to the high level signal outputted from the first delayer DL1. The first voltage regulator VR1 converts the main power $V_{EXT}$ into a low supply voltage and then outputs the converted low supply voltage to the inside of the chipset.

An output level of the first inverter IN1 becomes low from when the first delayer DL1 outputs a high level signal. Thus, the first input switch MF1 and the first output switch MB1 are turned off and thereby a discharge operation with respect to the first voltage regulator VR1 is stopped.

Similarly, after a delay time $T_{D2}$ from when the main power $V_{EXT}$ reaches the voltage detecting level V2 of the second voltage detector VD2 (t2), the second voltage regulator VR2 becomes an enable state and a discharge operation with respect to the second voltage regulator VR2 is stopped. After a delay time $T_{D3}$ from when the main power $V_{EXT}$ reaches the voltage detecting level V3 of the third voltage detector VD3 (t3), the third voltage regulator VR3 becomes an enable state and a discharge operation with respect to the third voltage regulator VR3 is stopped. Thus, the power supply circuit 300 becomes an enable state and a discharge operation is over.

If after the main power $V_{EXT}$ reaches the maximum voltage $V_M$, the main power $V_{EXT}$ is continuously supplied, the voltage regulators VR1~VR3 also continuously output a voltage into which the main power $V_{EXT}$ is converted to the inside of the chipset.

Thus, the enforced discharge unit 330 of the power supply circuit 300 discharges charges that remain at input and output stages of the voltage regulate unit 320 from when the inverters IN1~IN3 of the discharge control unit 330a are provided with a supply voltage to output a high level signal till an enable signal is outputted from the sequence control unit 310.

Figure 6:
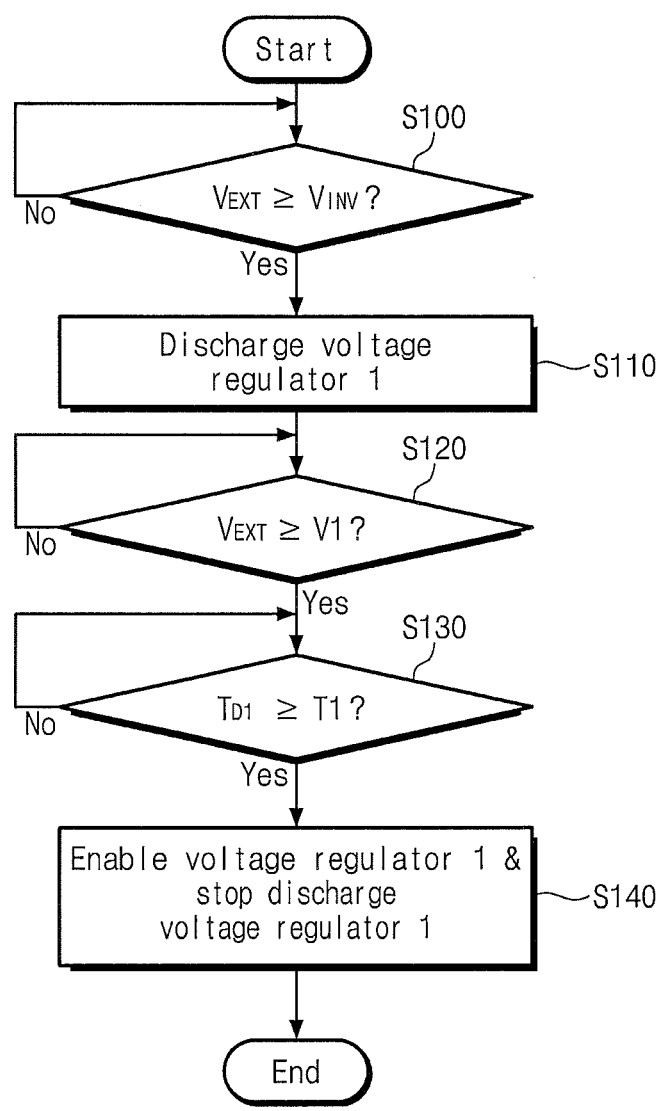
FIG. 6 is a flow chart illustrating a discharge operation of a power supply circuit in accordance with exemplary embodiments of the inventive concept.

FIG. 6 is a flow chart illustrating a discharge operation of a power supply circuit in accordance with exemplary embodiments of the inventive concept. Since discharge operation methods of first, second and third voltage detectors are similar to one another, in the present embodiment, a discharge operation method of the first voltage detector is described.

Referring to FIG. 6, if a voltage level of the main power $V_{EXT}$ reaches an operation level $V_{INV}$ of a discharge control unit (S100), the enforced discharge unit begins to operate. Remaining charges of all the voltage regulators including the first voltage detector are discharged by the enforced discharge unit (S110).

If a voltage level of the main power $V_{EXT}$ reaches a detecting voltage V1 of the first voltage detector (S120), a discharge operation with respect to remaining charges of the first voltage regulator continues during a delay time $T_{D1}$ of a first delayer connected to the first voltage detector. In FIG. 6, T1 is the elapsed time from when a voltage level of the main power $V_{EXT}$ reaches a detecting voltage V1 of the first voltage detector. If the elapsed time T1 exceeds the delay time $T_{D1}$ of the first delayer (S130), a discharge operation with respect to remaining charges of the first voltage regulator is stopped and the first voltage regulator becomes an enable state (S140).

Like the first voltage detector, if a voltage level of the main power $V_{EXT}$ reaches detecting voltages V2 and V3 of the second and third voltage detectors, the second and third voltage detectors discharge remaining charges during delay times $T_{D2}$ and $T_{D3}$ of delayers connected to the second and third voltage detectors respectively. If an elapsed time exceeds the delay times $T_{D2}$ and $T_{D3}$ of delayers, a discharge operation with respect to remaining charges of second and third voltage regulators is stopped and the second and third voltage regulators become an enable state.

Thus, the power supply circuit in accordance with exemplary embodiments of the inventive concept controls an output time of the voltage regulate unit through the voltage detect unit detecting a voltage level of the main power and the delay unit controlling an output time of the voltage detect unit. The power supply circuit discharges charges that remain before the voltage regulate unit operates through the enforced discharge unit. A sufficient remaining charge discharge time is obtained through a delay time of the delay unit of the power supply circuit.

In the power supply circuit, when the main power is applied, an applying order of power being supplied to the inside of the chipset is controlled and when the main power is interrupted, an interrupting order of power being supplied to the inside of the chipset is controlled.

Figure 7:
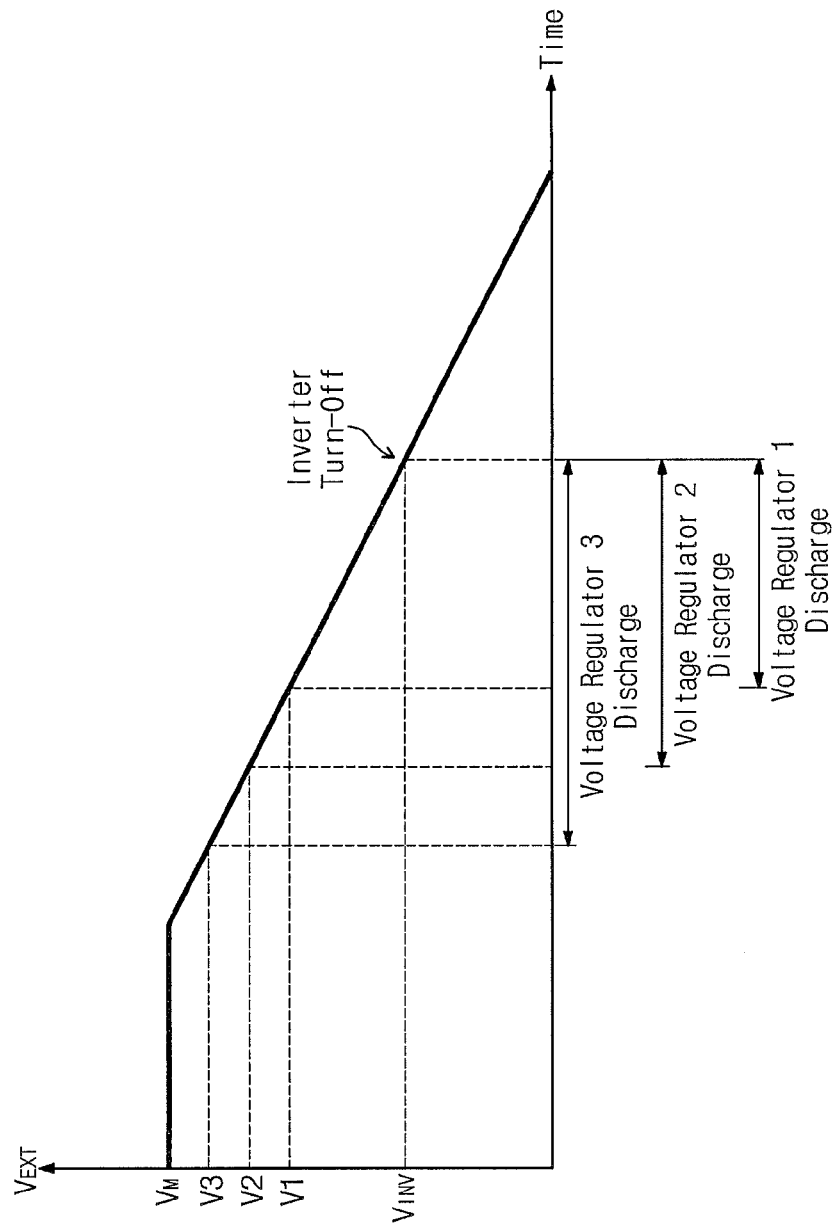
FIG. 7 is a graph showing an operation relative to time of a power supply circuit in accordance with exemplary embodiments of the inventive concept when a main power is interrupted.

FIG. 7 is a graph showing an operation relative to time of a power supply circuit in accordance with exemplary embodiments of the inventive concept when a main power is interrupted. Referring to FIG. 7, the main power $V_{EXT}$ is gradually reduced from the maximum voltage $V_M$.

If the main power $V_{EXT}$ is reduced below the detecting voltage V3 of the third voltage detector, the third voltage detector outputs a low level signal. As described with reference to FIG. 3, since the third delayer outputs a low level signal without delay, the third inverter outputs a high level signal accordingly. The third input switch and the third output switch provided with a high level signal from the third inverter are turned on. A discharge operation with respect to remaining charges of the third voltage regulator begins by the third input switch and the third output switch. The discharge operation with respect to remaining charges of the third voltage regulator continues until a voltage level of the main power $V_{EXT}$ is reduced below the inverter supply voltage VIN and thereby the inverter does not operate.

If a voltage level of the main power $V_{EXT}$ is reduced below the detecting voltage V2 of the second voltage detector, the second voltage detector outputs a low level signal. Thus, the second delayer outputs a low level signal without delay and the second inverter outputs a high level signal accordingly. The second input and output switches receiving the high level signal from the second inverter through their gates are turned on. Charges that remain at the second voltage regulator begin to be discharged by the second input and output switches. A discharge operation with respect to the second voltage regulator continues until a voltage level of the main power $V_{EXT}$ is reduced below the inverter supply voltage $V_{INV}$, so that inverter does not operate.

Similarly, if a voltage level of the main power $V_{EXT}$ is reduced below the detecting voltage V1 of the first voltage detector, the first voltage detector outputs a low level signal. The first delayer outputs a low level signal without delay and the first inverter outputs a high level signal accordingly. The first input and output switches receiving the high level signal from the first inverter through their gates are turned on. Charges that remain at the first voltage regulator begin to be discharged by the first input and output switches. A discharge operation with respect to the first voltage regulator continues until a voltage level of the main power $V_{EXT}$ is reduced below the inverter supply voltage $V_{INV}$, so that inverter does not operate.

Thus, if a voltage level of the main power $V_{EXT}$ is reduced below the inverter supply voltage $V_{INV}$, a discharge operation of the power supply circuit is stopped and the power supply circuit turned off.

As described above, a discharge speed of charges at the input discharge unit and the output discharge unit of the enforced discharge unit depends on the quantity of currents flowing through the switches. The quantity of currents flowing through the switches is determined by a characteristic of each switch and resistance values of the resistors connected to the switches. Thus, a discharge speed with respect to each block, for example, each voltage regulator, can be changed by controlling resistance values of the input resistors and the output resistors.

An interrupting speed of supply voltages being input to the inside of the chipset depends on a discharge speed with respect to an output unit of the voltage regulators that output supply voltages. Thus, the power supply circuit controls an interrupting order of the supply voltages being input to the inside of the chipset by controlling a speed of discharging charges that remain at an output unit of the voltage detect unit.

Figure 8:
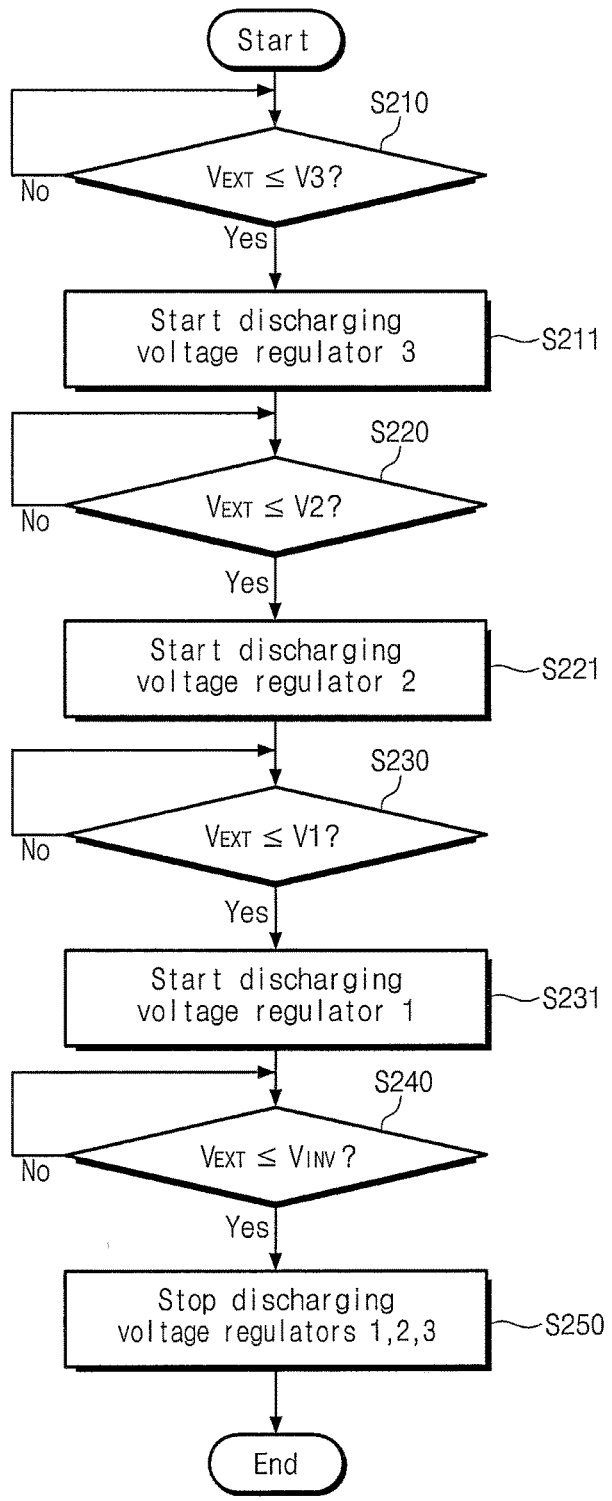
FIG. 8 is a flow chart illustrating an operation of a power supply circuit in accordance with exemplary embodiments of the inventive concept when a main power is interrupted.

FIG. 8 is a flow chart illustrating an operation of a power supply circuit in accordance with exemplary embodiments of the inventive concept when a main power is interrupted. Referring to FIG. 8, if a voltage level of the main power $R_{EXT}$ is reduced below the detecting voltage V3 of the third voltage detector (S210), remaining charges of the third voltage regulator are discharged by the enforced discharge unit (S211).

If a voltage level of the main power $V_{EXT}$ is reduced below the detecting voltage V2 of the second voltage detector (S220), remaining charges of the second voltage regulator are discharged by the enforced discharge unit (S221). If a voltage level of the main power $V_{EXT}$ is reduced below the detecting voltage V1 of the first voltage detector (S230), remaining charges of the first voltage regulator are discharged by the enforced discharge unit (S231). When a voltage level of the main power $V_{EXT}$ is reduced below the inverter supply voltage (S240), the discharge operation is stopped (S250).

In the embodiment described above, a discharge operation of when the backup power unit 340 of FIG. 4 does not exist is disclosed but the inventive concept is not limited to this example. A discharge operation of when the backup power unit 340 of FIG. 4 exists is performed depending on a voltage of the backup power unit 340. That is, in the case that the backup power unit 340 exists, even when the main power $V_{EXT}$ is reduced below the inverter supply voltage $V_{INV}$, a discharge operation can be continuously performed before a voltage of the backup power unit 340 is reduced below the inverter supply voltage $V_{INV}$.

The power supply circuit and the memory system including the power supply circuit can control the order that a voltage is supplied to the chipset and a supply voltage to the chipset is interrupted and a discharge operation with respect to remaining charges using a hardware operation. The memory system can prevent damage or a malfunction of chipset internal devices caused by a sudden current supply and sudden current interruption through the operation described above.

The power supply circuit and the memory system including the power supply circuit can also control the order that a voltage is supplied to the chipset and a supply voltage to the chipset is interrupted in software. A memory system controlling a power supply operation using software and hardware is described below.

Figure 9:
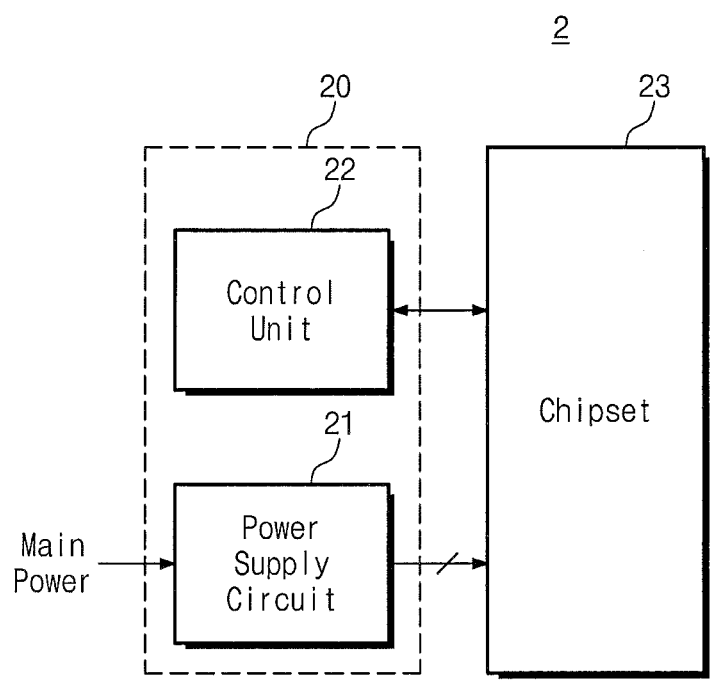
FIG. 9 is a block diagram illustrating a nonvolatile memory system in accordance with other exemplary embodiments of the inventive concept.

FIG. 9 is a block diagram illustrating a nonvolatile memory system in accordance with other exemplary embodiments of the inventive concept. Referring to FIG. 9, a memory system 2 includes a power supply device 20 and a chipset 23.

The power supply device 20 is connected to a main power and is supplied with the whole power required for an operation of the memory system 2 from the main power. The power supply device 20 provides a supply voltage to the chipset 23 using the inputted main power. The power supply device 20 includes a control unit 22 and a power supply circuit 21.

Internal devices of the chipset 23 can require supply voltages having different levels. The power supply device 20 can convert the main power into a plurality of supply voltages and provide the converted supply voltages to the chipset 23.

The power supply device 20 can supply the supply voltages to the chipset 23 in the pre-designated order in response to an increase of a voltage level of the main power. The power supply device 20 can perform the operation described above using hardware and software. The power supply device 20 can control a pre-control supply voltage group including at least one pre-control supply voltage in hardware and can control a post-control supply voltage group including at least post-control supply voltage in software using the control unit 22. The power supply device 20 can control a supplying and interrupting operation with respect to a portion of supply voltage in software to reduce complexity of embodiment and improve stability of operation. A supply and interrupt operation of a voltage of the power supply device 20 will be described in detail with reference to FIG. 10.

Figure 10:
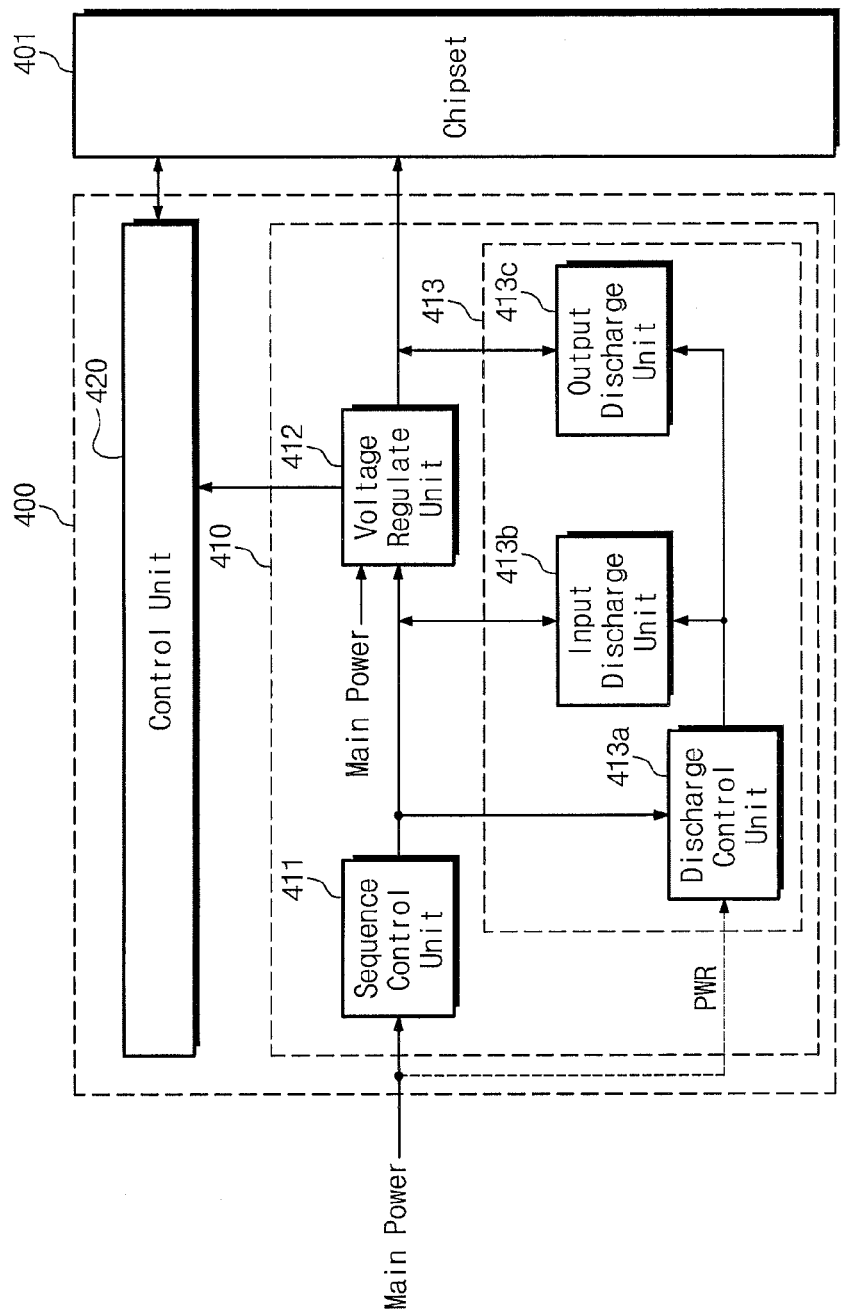
FIG. 10 is a block diagram illustrating an embodiment of a memory system of FIG. 9.

FIG. 10 is a block diagram illustrating an embodiment of the memory system 2 of FIG. 9. Referring to FIG. 10, a power supply device 400 includes a power supply circuit 410 and a control unit 420. The power supply device 400 can control a power supply to a chipset 401 in hardware using the power supply circuit 410 and in software using the control unit 420.

The power supply circuit 410 provides a supply voltage to the chipset 401 and the control unit 420. The control unit 420 provides a command to the chipset 401 to control whether or not supply voltages having a predetermined level among a plurality of supply voltages being provided to the chipset 401 from the power supply circuit 410 are activated in the chipset 401. The control unit 420 may be a processing device including a CPU.

The power supply device 410 includes a sequence control unit 411, a voltage regulate unit 412 and an enforced discharge unit 413.

The sequence control unit 411 controls an operation of the voltage regulate unit 412 using an enable signal. The sequence control unit 411 can control an applying order between a plurality of supply voltages being input to the chipset 401 using the voltage regulate unit 412.

The sequence control unit 411 detects a voltage level of the main power input from the outside. When the main power reaches a pre-designated voltage detecting level, the sequence control unit 411 generates a detecting signal. The sequence control unit 411 delays the generated detecting signal for a predetermined delay time, and then outputs the delayed detecting signal as an enable signal.

A voltage level of the main power being detected in the sequence control unit 411 and a detecting signal being generated in response to the voltage level of the main power may be one or more. Delay times corresponding to the different generated detecting signals may be different from one another. The sequence control unit 411 outputs signals delayed for different delay times according to a voltage level of the main power as an enable signal using the detecting signals and the delay times set in response to the detecting signals.

The voltage regulate unit 412 converts the main power into a plurality of supply voltages having different levels. The voltage regulate unit 412 includes a plurality of voltage regulators. Each voltage regulator is inputted with the main power and an enable signal input. If an enable signal is input, each voltage regulator converts the inputted main power into a supply voltage having a pre-designated voltage level to output the supply voltage.

The voltage regulators included in the voltage regulate unit 412 can be classified into three groups. Voltage regulators of a first group output at least one supply voltage being supplied to the chipset 401 in response to an enable signal being provided from the sequence control unit 411. Supply voltages being output from the voltage regulators of the first group constitute a pre-control supply voltage group.

Voltage regulators of a second group are provided with the main power as an enable signal instead of an enable signal being provided from the sequence control unit 411 and provide at least one supply voltage output in response to the enable signal to the chipset 401. Supply voltages being output from the voltage regulators of the second group constitute a post-control supply voltage group.

Voltage regulators of a third group are provided with the main power as an enable signal instead of an enable signal being provided from the sequence control unit 411 and provide a supply voltage output in response to the enable signal to the control unit 420.

The supply voltages being output from the voltage regulators of the first group can be controlled in hardware using the sequence control unit 411 and the supply voltages being output from the voltage regulators of the second group can be controlled in software using the control unit 420. An operation of each group of the voltage regulate unit 412 will be described in further detail with reference to FIG. 12.

The enforced discharge unit 413 forcibly generates a discharge current to discharge charges. The enforced discharge unit 413 discharges charges that remain at a capacitor of the power supply circuit 410 before a voltage is supplied to the chipset 401. The enforced discharge unit 413 discharges charges that remain at the power supply circuit 410 when the main power is interrupted. The enforced discharge unit 413 includes a discharge control unit 413a, an input discharge unit 413b and an output discharge unit 413c.

The discharge control unit 413a controls the input discharge unit 413b and the output discharge unit 413c using an enable signal input from the sequence control unit 411. For example, if the enable signal input from the sequence control unit 411 is a low level signal, the discharge control unit 413a generates a discharge signal to transmit the generated discharge signal to the input discharge unit 413b and the output discharge unit 413c so that charges that remain at the input discharge unit 413b and the output discharge unit 413c are discharged.

The voltage regulate unit 412 can perform an operation complementary to the discharge control unit 413a. The discharge control unit 413a can control the input discharge unit 413b and the output discharge unit 413c so that remaining charges are discharged when the voltage regulate unit 412 is in a no-operation state and a discharge operation with respect to remaining charges is stopped when the voltage regulate unit 412 is in an operation state.

The input discharge unit 413b discharges charges that remain at an input stage of the voltage regulate unit 412. The input discharge unit 413b can discharge only charges that remain at an input stage of the voltage regulators that belong to the first group of the voltage regulate unit 412. The input discharge unit 413b can selectively discharge only charges that remain at the input stage of the voltage regulators being controlled in hardware to reduce complexity of embodiment. The input discharge unit 413b can be constituted by a resistor and a semiconductor switch. As described above, a discharge operation of the input discharge unit 413b is controlled through a discharge signal input from the discharge control unit 413a.

The output discharge unit 413c discharges charges that remain at an output stage of the voltage regulate unit 412. The output discharge unit 413c can discharge only charges that remain at output stages of voltage regulators which belong to the first group of the voltage regulate unit 412. The output discharge unit 413c can selectively discharge only charges that remain at output stages of voltage regulators controlled in hardware to reduce complexity of embodiment. The output discharge unit 413c can be constituted by a resistor and a semiconductor switch. As described above, a discharge operation of the output discharge unit 413c is controlled through a discharge signal input from the discharge control unit 413a.

The quantity of discharge currents being discharged through the enforced discharge unit 413 may be changed. A discharge speed and a discharge time of remaining current can be controlled through a control of the quantity of discharge currents. A discharge current amount of each block being discharged by the enforced discharge unit 413 may be changed. Through the change of the discharge current amount, the enforced discharge unit 413 can make each block discharged in a pre-designated order.

As described above, the power supply device 400 can supply a supply voltage having a plurality of levels to the chipset 401 in a pre-designated order using software and hardware. The power supply device 400 can forcibly charges that remain at a power supply circuit before power is supplied to the chipset 401 and when power is interrupted. The power supply device 400 can control the order that a supply voltage is supplied and interrupted in software and hardware to prevent damage and malfunction of chipset internal elements that may be caused by sudden current supply and sudden current breaking with low complexity.

Figure 11:
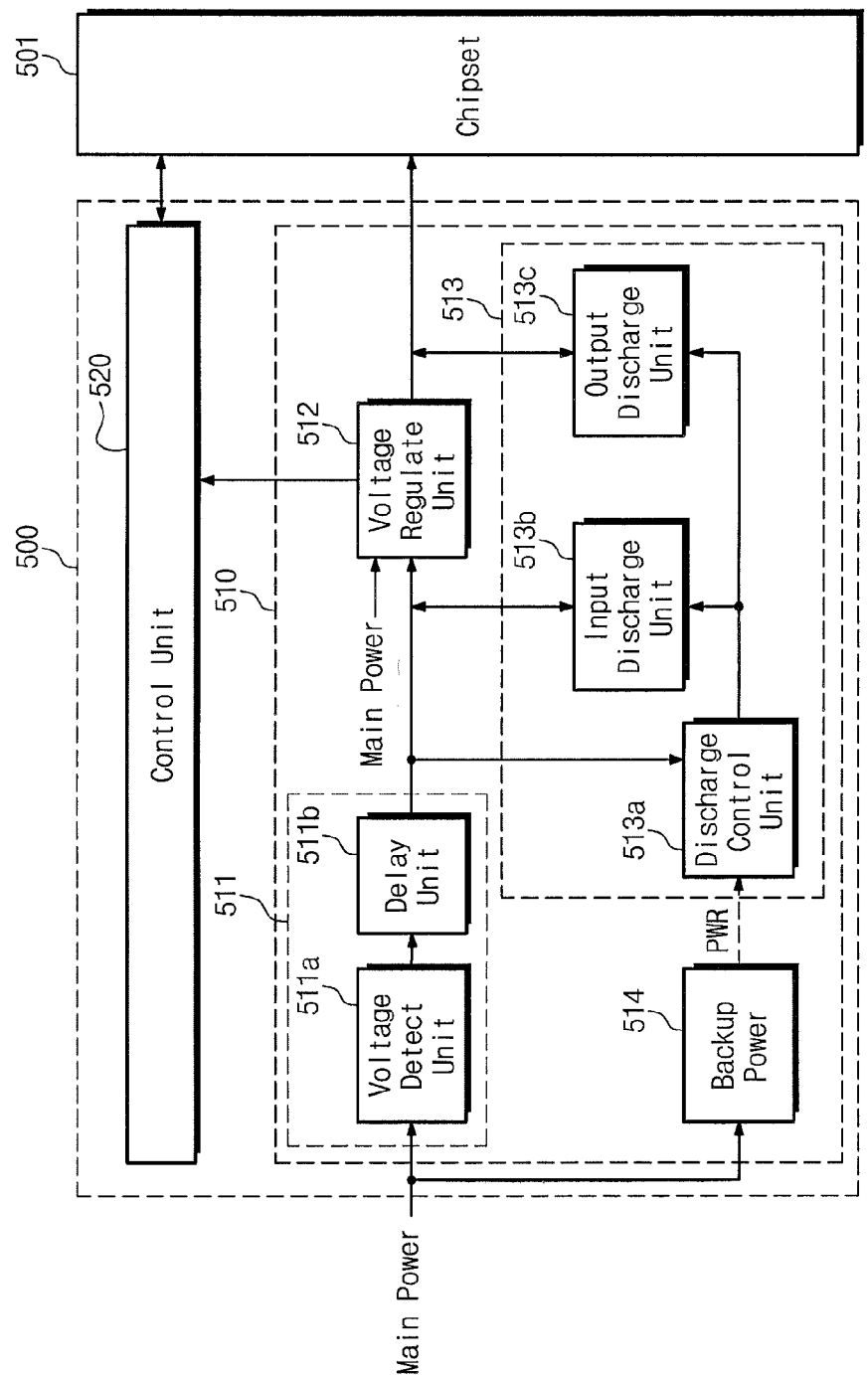
FIG. 11 is a block diagram illustrating another embodiment of a memory system of FIG. 9.

FIG. 11 is a block diagram illustrating another embodiment of a memory system of FIG. 9. Referring to FIG. 11, a power supply device 500 includes a power supply circuit 510 and a control unit 520. The power supply device 500 can control a power supply to a chipset 501 in hardware using the power supply circuit 510 and in software using the control unit 520. In addition, the power supply device 500 can be stably operated using a backup power unit 514 even when main power is interrupted.

The power supply circuit 510 includes a sequence control unit 511, a voltage regulate unit 512, an enforced discharge unit 513 and the backup power unit 514. The voltage regulate unit 512 and the enforced discharge unit 513 of the power supply circuit 510 of FIG. 11 may be constituted to be the same with the voltage regulate unit 412 and the enforced discharge unit 413 of the power supply circuit 410 of FIG. 10.

The sequence control unit 511 includes a voltage detect unit 511a and a delay unit 511b.

The voltage detect unit 511a is connected to the main power to detect a level of the main power. The voltage detect unit 511a includes at least one voltage detector to detect a voltage level of the main power. If the main power reaches a pre-designated voltage detecting level, the voltage detector outputs a detecting signal. The detecting signal may be a high level signal. Voltage detecting levels needed for the voltage detectors included in the voltage detect unit 511a to output a detecting signal may be different from one another.

The delay unit 511b is connected to the voltage detect unit 511a. The delay unit 511b delays an output of the voltage detect unit 511a for a pre-designated time and then outputs the delayed output. The delay unit 511b includes at least one delayer. Each delayer is connected to a corresponding voltage detector to delay an output of the voltage detector for a pre-designated time. Delay times of delayers included in the delay unit 511b may be different from one another.

The backup power unit 514 stores power input from the main power. If the main power is interrupted, the backup power unit 514 supplies the stored power to the enforced discharge unit 513. This can make the enforced discharge unit 514 operate while the backup power unit 514 is discharged even when the main power is interrupted.

Since even when the main power is interrupted, the enforced discharge unit 513 of the power supply device 500 can stably operate, charges that remain in the power supply circuit 510 can be stably discharged even when the main power is interrupted. Thus, the power supply device 500 can more stably control supplying order and interrupting order of the supply voltage than the power supply device 400. The power supply device 500 can prevent damage of chipset internal elements that may be caused by sudden current supply and sudden current breaking through the operation described above.

Figure 12:
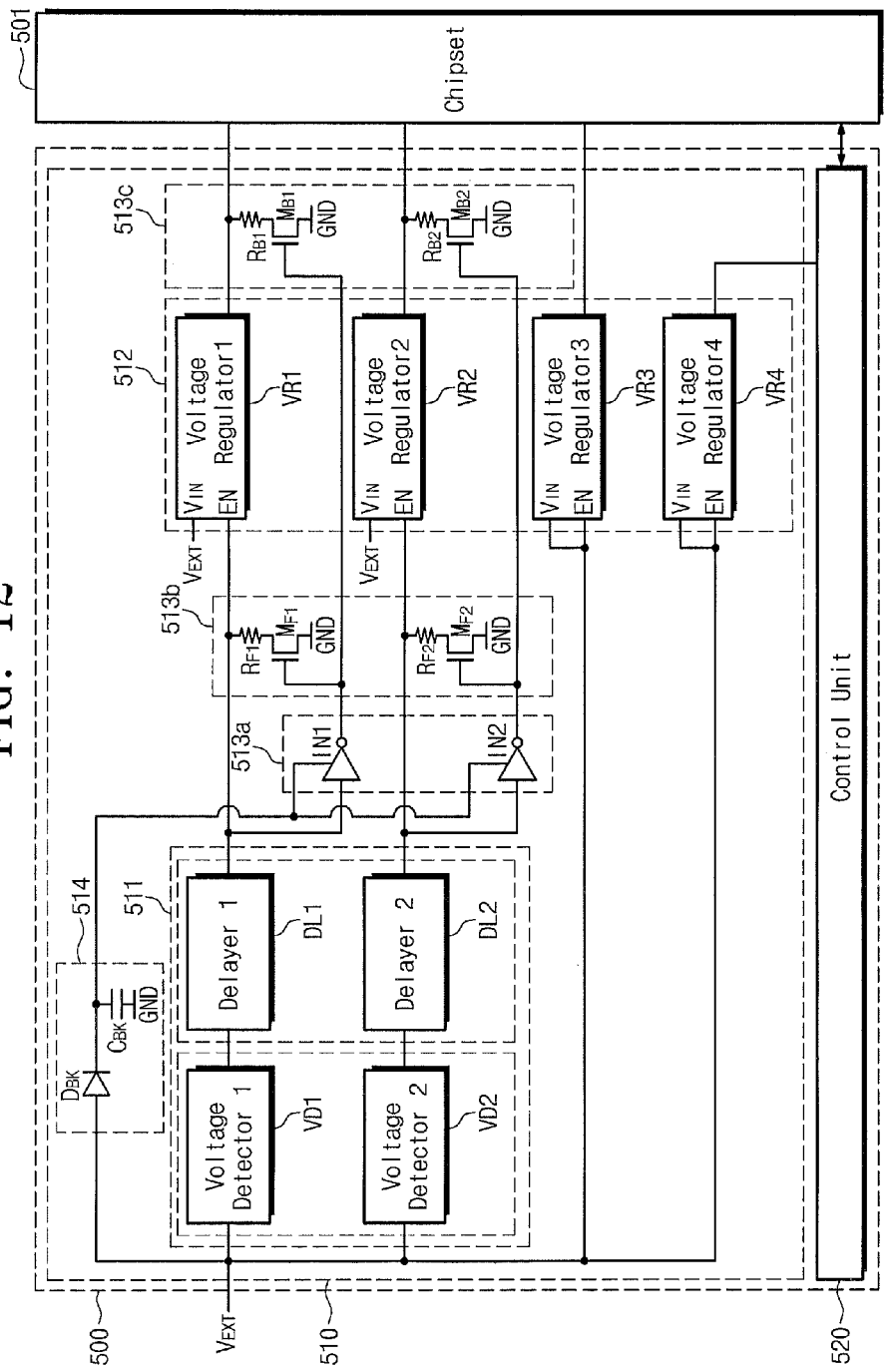
FIG. 12 is a drawing illustrating an embodiment of a memory system of FIG. 11.

FIG. 12 is a drawing illustrating an embodiment of a memory system of FIG. 11. Referring to FIG. 12, a power supply device 500 includes a power supply circuit 510 and a control unit 520. The power supply circuit 510 includes a sequence control unit 511, a voltage regulate unit 512, an enforced discharge unit 513 and the backup power unit 514.

The sequence control unit 511 includes a voltage detect unit 511a and a delay unit 511b. The voltage detect unit 511a includes a first voltage detector VD1 and a second voltage detector VD2. The delay unit 511b includes a first delayer DL1 and a second delayer DL2. However, this is only an illustration and the number of voltage detectors and delayers for embodying a technical feature of the inventive concept is not limited. For example, the inventive concept can be applied to all power supply devices including two or more voltage detectors and delayers.

When a main power $V_{EXT}$ reaches a pre-designated voltage detecting level, the voltage detectors VD1 and VD2 outputs a detecting signal. The detecting signal output from the voltage detectors VD1 and VD2 may be a high level output signal. It is assumed that a relationship between a voltage detecting level V1 of the first voltage detector VD1 and a voltage detecting level V2 of the second voltage detector VD2 is V1<V2.

When the main power $V_{EXT}$ is supplied to the power supply circuit 510, a voltage level of the main power $V_{EXT}$ reaches V1 and V2 in the order of V1 and V2. Thus, a high level signal is output in the order of the first voltage detector VD1 and the second voltage detector VD2.

When a high level signal is input, the delayers DL1 and DL2 delay the inputted signal for a pre-designated time and then output the delayed inputted signal. It is assumed that a relationship between a delay time TD1 of the first delayer DL1 and a delay time TD2 of the second delayer DL2 is TD1<TD2. If a signal being input is changed from a high level to a low level, the delayers DL1 and DL2 immediately output a low level signal without a delay of the inputted signal.

If a high level signal is output in the order of the first voltage detector VD1 and the second voltage detector VD2, the outputted signal is input to the first delayer DL1 and the second delayer DL2 respectively to be delayed and then the delayed signal is output. Thus, time that a signal is output from each delayer depends on time that a voltage detector connected to each delayer recognizes the main power $V_{EXT}$ and a delay time of the delayer.

The voltage regulate unit 512 includes a first voltage regulator VR1, a second voltage regulator VR2, a third voltage regulator VR3 and a fourth voltage regulator VR4. However, this is only an illustration and the number of voltage regulators of the inventive concept is not limited. For example, the inventive concept can be applied to all power supply circuits having two or more voltage regulators.

Each of the voltage regulators VR1~VR4 has a power $V_{IN}$ input and an enable signal (EN) input. If an enable signal is input, each voltage regulator converts the inputted main power $V_{EXT}$ into a pre-designated voltage level and then outputs the pre-designated voltage level. The voltage regulators VR1~VR4 may be divided into a plurality of groups.

The voltage regulators VR1 and VR2 constitute a first group. The voltage regulators VR1 and VR2 of the first group are inputted with the main power $V_{EXT}$ as the power $V_{IN}$ input. The enable signal (EN) inputs of the voltage regulators VR1 and VR2 are connected to outputs of the delayers DL1 and DL2 of the delay unit 511b respectively. Thus, outputs of the voltage regulators VR1 and VR2 included in the first group are determined according to whether or not the main power $V_{EXT}$ is applied and output voltage levels of the delayers connected to the voltage regulators VR1 and VR2. A voltage being output from the first voltage regulator VR1 may be 3.3V and a voltage being output from the second voltage regulator VR2 may be 1.8V.

The voltage regulators VR3 constitutes a second group. The voltage regulator VR3 of the second group is inputted with the main power $V_{EXT}$ as the power and the enable signal (EN). If the main power $V_{EXT}$ reaches a predetermined level, the voltage regulator VR3 converts the inputted main power $V_{EXT}$ into a pre-designated voltage level and then outputs the pre-designated voltage level. A voltage being output from the voltage regulator VR3 is supplied to the chipset 501. The voltage being output from the voltage regulator VR3 may be a high voltage, for example, 12V. Whether or not the voltage being output from the voltage regulator VR3 is activated in the chipset 501 can be controlled by a command being provided from the control unit 520 to the chipset 501 in software.

The voltage regulator VR4 constitutes a third group. The voltage regulator VR4 of the third group is inputted with the main power $V_{EXT}$ as power and an enable signal. If the main power $V_{EXT}$ reaches a predetermined level, the voltage regulator VR4 converts the inputted main power $V_{EXT}$ into a pre-designated voltage level and then outputs the pre-designated voltage level. A voltage being output from the voltage regulator VR4 is supplied to the control unit 520.

The voltage discharge unit 513 includes a discharge control unit 513a, an input discharge unit 513b and an output discharge unit 513c. For example, the enforced discharge unit 513 discharges charges that remain at input and output stages of the voltage regulate unit 512 on the basis of an enable signal output from the sequence control unit 511.

The voltage discharge unit 513 can selectively perform a charge discharge operation on a part of the voltage regulate unit 512. For example, the enforced discharge unit 513 can discharge only charges that remain at input and output stages of the voltage regulators VR1 and VR2 of the first group among the voltage regulators included in the voltage regulate unit 512.

The discharge control unit 513a controls an operation of the input discharge unit 513b and the output discharge unit 513c on the basis of an enable signal output from the sequence control unit 511. The discharge control unit 513a includes a first inverter IN1 and a second inverter IN2.

The input discharge unit 513b is connected to an input stage of the voltage regulate unit 512. The input discharge unit 513b is connected to input stages of the voltage regulators VR1 and VR2 of the first group included in the voltage regulate unit 512. The input discharge unit 513b forcibly generates a current between input stages of the voltage regulate unit 512 and a ground to discharge remaining charges. The input discharge unit 513b includes a first input resistor $R_{F1}$, a second input resistor $R_{F2}$, a first input switch $M_{F1}$ and a second input switch $M_{F2}$.

The output discharge unit 513c is connected to an output stage of the voltage regulate unit 512. The output discharge unit 513c is connected to output stages of the voltage regulators VR1 and VR2 of the first group included in the voltage regulate unit 512. The output discharge unit 513c forcibly generates a current between output stages of the voltage regulate unit 512 and a ground to discharge remaining charges. The output discharge unit 513c includes a first output resistor $R_{B1}$, a second output resistor $R_{B2}$, a first output switch $M_{B1}$ and a second output switch $M_{B2}$.

As described above, the voltage discharge unit 513 performs a charge discharge operation on only charges that remain at input and output stages of the voltage regulate unit 512 being controlled in hardware and thereby complexity of embodiment can be reduced.

The backup power unit 514 stores power supplied from the main power $V_{EXT}$. The backup power unit 514 includes a backup diode $D_{BK}$ and a backup capacitor $C_{BK}$. The backup power unit 514 supplies power stored in the backup capacitor $C_{BK}$ through the backup diode $D_{BK}$ as a supply voltage of the discharge control unit 513a. Thus, even when the main power $V_{EXT}$ is interrupted, the discharge control unit 513a can operate until power stored in the backup power unit 514 is consumed.

The control unit 520 is provided with power from the power supply circuit 510. The control unit 520 controls an activation operation of a part of supply voltages with which the power supply circuit 510 provides the chipset 501, for example, a supply voltage being output from the voltage regulator VR3 included in the second group. The chipset 501 does not use a supply voltage being provided from the voltage regulator VR3 included in the second group till a command is received from the control unit 520.

If a predetermined condition is satisfied, the control unit 520 can provide a command activating a predetermined supply voltage to the chipset 501. In the case that the control unit 520 is connected to the chipset 501 through an ONF1 interface, the control unit 520 can provide a command to the chipset 501 in a set feature command form. The control unit 520 can provide a command to the chipset 501 after a reset operation is performed. The control unit 520 can provide a command while a booting operation is performed by a loaded firmware.

A level of a supply voltage being controlled by the control unit 520 may be high, for example, 12V. Using software, the control unit 520 controls so that a supply voltage having a high level is activated in the chipset 501 after a reset operation is performed, thereby controlling the order that the supply voltage is provided to the chipset 501.

The control unit 520 can control an inactivated operation of a part of supply voltages with which the power supply circuit 501 provides the chipset 501, for example, a supply voltage being output from the voltage regulator VR3 included in the second group.

If a predetermined condition is satisfied, the control unit 520 can provide a command inactivating a predetermined supply voltage to the chipset 501. The control unit 520 can provide a command to the chipset 501 in a set feature command form. If the main power $V_{EXT}$ is turned off, the control unit 520 dumps data being in progress and then provides a command to the chipset 501. The command can be provided while auxiliary power is provided to the power supply device 500. After that, if the auxiliary power is consumed and thereby a level of a voltage being provided to the power supply circuit 510 is reduced, supply voltages being output from the voltage regulators VR1 and VR2 included in the first group may be interrupted in hardware.

The power supply device 500 can control high voltages among supply voltages being supplied to the chipset 501 in software using control unit 520 and can control the remaining supply voltages in hardware using the power supply circuit 510. The power supply device 500 can prevent damage and malfunction of internal elements of the chipset 501 that may be caused by sudden current supply and sudden current breaking with low complexity by controlling the order that a voltage is supplied the chipset 501 and a voltage being supplied to the chipset 11 is interrupted in software and hardware.

Figure 13:
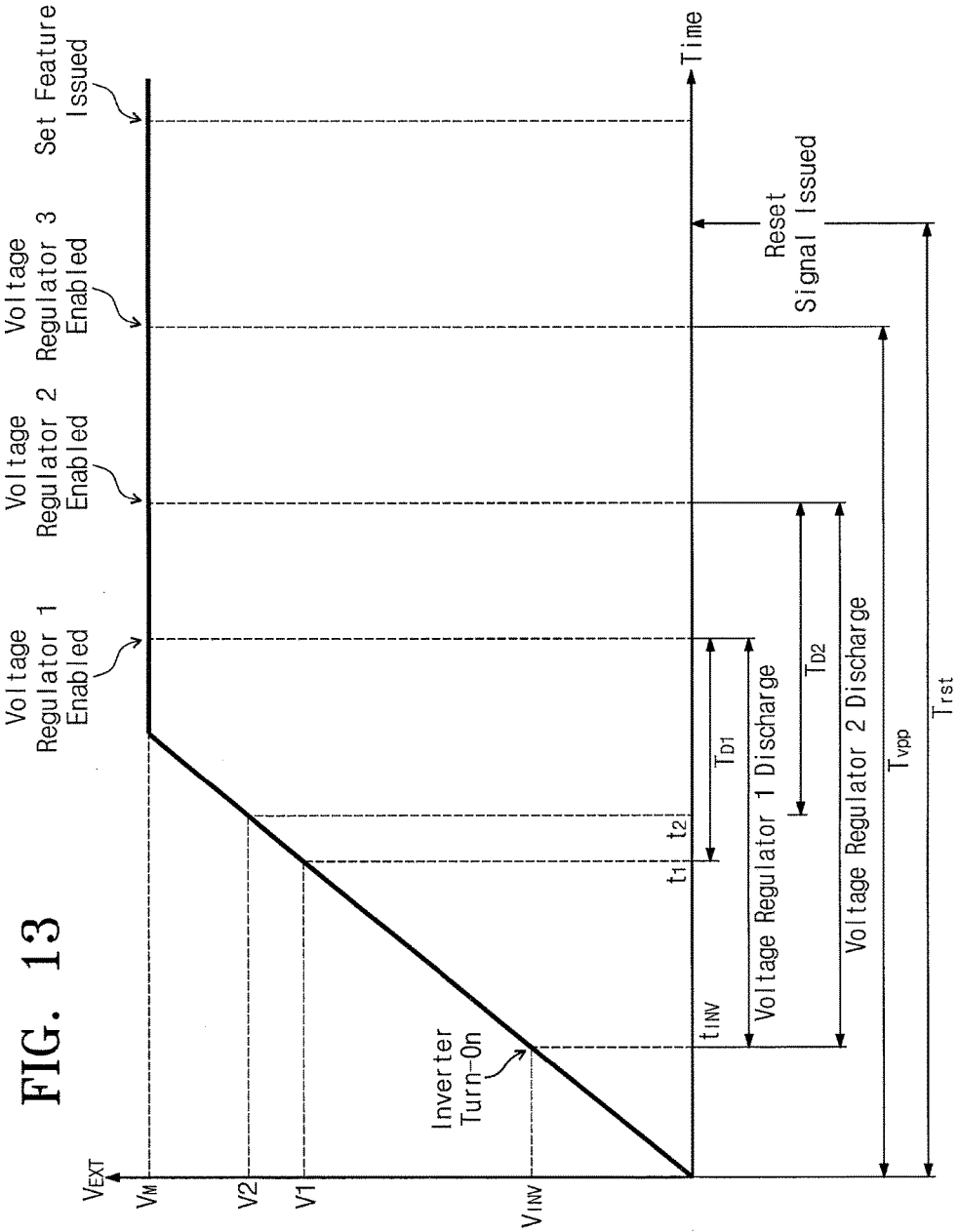
FIG. 13 is a graph showing an operation of when a main power is applied to a power supply device relative to time.

A power supply and a discharge operation of the power supply device 500 will be described in detail with reference to FIG. 13. FIG. 13 is a graph showing an operation of when a main power is applied to a power supply device relative to time.

Referring to FIG. 13, the main power $V_{EXT}$ being applied to a circuit reaches an inverter supply voltage $V_{INV}$ first. The inverter supply voltage $V_{INV}$ is a supply voltage of the inverters included in the discharge control unit 513a.

Since when the main power $V_{EXT}$ reaches the inverter supply voltage VINV at time $t_{INV}$, the main power $V_{EXT}$ does not reach a voltage detecting level of the sequence control unit 513 yet, an output of the sequence control unit 513 is in a low state. Thus, a high level signal is output from the discharge control unit 513a.

Further referring to FIG. 12, output stages of the discharge control unit 513a are connected to gates of switches of the input discharge unit 513b and the output discharge unit 513c. As a high level output signal of the discharge control unit 513a is input to the gates of the switches, the first and second input switches $M_{F1}$ and $M_{F2}$ and the first and second output switches $M_{B1}$ and $M_{B2}$ are turned on. Thus, charges that remain at input stages of the first group of the voltage regulate unit 512 are discharged by the input discharge unit 513b and charges that remain at output stages of the first group of the voltage regulate unit 512 are discharged by the output discharge unit 513c.

A speed that charges are discharged in the input discharge unit 513b and the output discharge unit 513c depends on the quantity of currents flowing through the switches of the input discharge unit 513b and the output discharge unit 513c. The quantity of currents flowing through the switches is determined by a characteristic of each switch and resistance values of resistors connected to the switches. Thus, if using the same switches, a discharge speed of each block may be changed by controlling resistance values of the input resistors $R_{F1}$ and $R_{F2}$ and output resistors $R_{B1}$ and $R_{B2}$.

Further referring to FIG. 13, if a level of the main power $V_{EXT}$ continues to be increased, the level of the main power $V_{EXT}$ reaches a voltage detecting level V1 of the first voltage detector VD1. The first voltage detector VD1 outputs a high level signal from when the main power $V_{EXT}$ reaches a voltage detecting level V1 of the first voltage detector VD1.

The first delayer DL1 delays a high level output signal of the first voltage detector VD1. The first delayer DL1 in a low level signal output state outputs a high level signal after delay time $T_{D1}$ passes from when the main power $V_{EXT}$ reaches a voltage detecting level V1 of the first voltage detector VD1.

The high level signal output from the first delayer DL1 becomes an enable signal (EN) input of the first voltage regulator VR1. As the first delayer DL1 outputs a high level signal, the first voltage regulator VR1 becomes an enable state. The first voltage regulator VR1 converts the main power $V_{EXT}$ into a low supply voltage and then outputs the converted low supply voltage to the inside of the chipset.

An output of the first inverter IN1 becomes low from when the first delayer DL1 outputs a high level signal. Thus, the first input switch $M_{F1}$ and the first output switch $M_{B1}$ are turned off and thereby a discharge of the first voltage regulator VR1 is stop. Similarly, if delay time $T_{D2}$ passes from when the main power $V_{EXT}$ reaches a voltage detecting level V2 of the second voltage detector VD2, the second voltage regulator VR2 becomes an operation state and a discharge of the second voltage regulator VR2 is stop.

If the main power $V_{EXT}$ begins to be provided, the control unit 520 provides a reset signal to the chipset 501 after a predetermined time $T_{rst}$ passes. The third voltage regulator VR3 becomes an operation state before a reset signal is provided. Since it is alight that the third voltage regulator VR3 becomes an operation state any time before a reset signal is provided, if time Tvpp from when the main power VEXT begins to be provided till the third voltage regulator VR3 becomes an operation state is less than the reset signal providing time Trst, the time Tvpp is not limited.

After providing a reset signal, the control unit 520 provides a command to activate a voltage output from the third voltage regulator VR3 to the chipset 501 while performing a booting operation using software. The command may be provided in a set feature command form.

According to the operation described above, the power supply device 500 can control high voltages among supply voltages being supplied to the chipset 501 in software using the control unit 520 and can control the remaining voltages in hardware using the power supply circuit 510. The power supply device 500 can control the order that a supply voltage is supplied to the chipset 501 and the supply voltage being supplied to the chipset 501 is interrupted in software and hardware to prevent damage and malfunction of chipset internal elements that may be caused by sudden current supply and sudden current breaking with low complexity.

Figure 14:
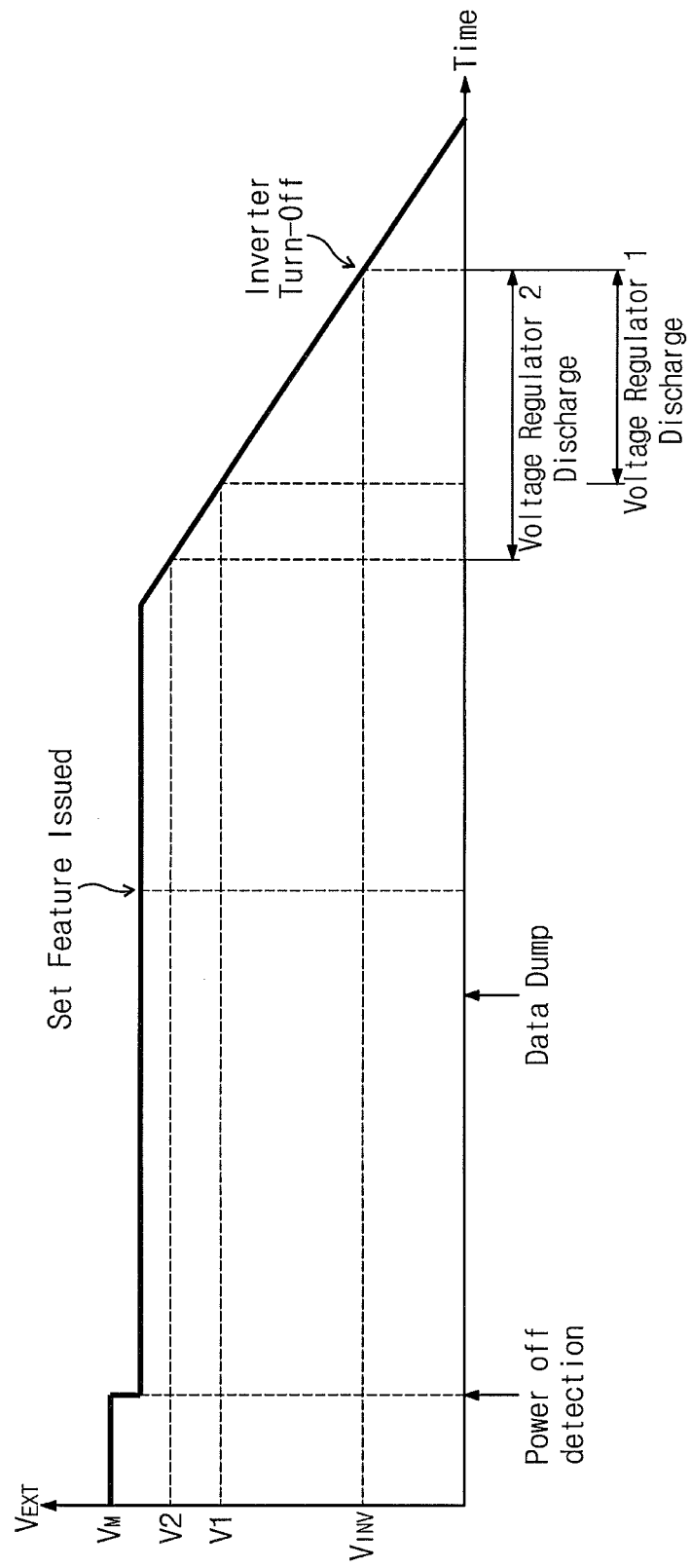
FIG. 14 is a graph showing an operation of a power supply device relative to time when a main power is interrupted.

FIG. 14 is a graph showing an operation of a power supply device relative to time when a main power is interrupted. Referring to FIG. 14, the main power VEXT is gradually reduced from the maximum voltage $V_M$.

If it is detected that the main power $V_{EXT}$ is turned off, the control unit 520 performs a dump operation on data being used while an auxiliary power is maintained. By the data dump operation, the work of the control unit 520 can be protected even when the main power $V_{EXT}$ is turned off.

If the data dump operation is completed, the control unit 520 provides a command for inactivating a voltage output from the third voltage regulator VR3 to the chipset 501. The command can be provided in a set feature command form.

If the auxiliary power is used up, a level of the main power $V_{EXT}$ being provided to the power supply circuit 510 is gradually reduced. If a level of the main power $V_{EXT}$ is reduced below the detecting voltage V2 of the second voltage detector VD2, the second voltage detector VD2 outputs a low level signal. As described above, since the second delayer DL2 outputs a low level signal without delay, the second inverter IN2 outputs a high level signal. The second input switch and the second output switch that are inputted with the high level signal from the second inverter IN2 are turned on. Remaining charges of the second voltage regulator VR2 begin to be discharged by the second input switch and the second output switch. Remaining charges of the second voltage regulator VR2 continue to be discharged until a voltage level of the main power $V_{EXT}$ is reduced below the inverter supply voltage $V_{INV}$ and thereby the inverter does not operate.

Similarly, if a level of the main power $V_{EXT}$ is reduced below the detecting voltage V1 of the first voltage detector VD1, the first voltage detector VD1 outputs a low level signal. The first delayer DL1 outputs a low level signal without delay and thereby the first inverter IN1 outputs a high level signal. The first input switch and the first output switch that are inputted with the high level signal from the first inverter IN1 are turned on.

Remaining charges of the first voltage regulator VR1 begin to be discharged by the first input switch and the first output switch. Remaining charges of the first voltage regulator VR1 continue to be discharged until a voltage level of the main power $V_{EXT}$ is reduced below the inverter supply voltage $V_{INV}$ and thereby the inverter does not operate.

Thus, if a voltage level a discharge operation is reduced below the inverter supply voltage $V_{INV}$, a discharge operation of the power supply circuit is finished and the power supply circuit becomes off-state.

In the embodiment described above, a discharge operation of the case that the backup power unit 340 of FIG. 4 does not exist is described but the inventive concept is not limited thereto. A discharge operation of the case that the backup power unit 340 of FIG. 4 exists performed depending on a voltage of the backup power unit 340. That is, in the case that the backup power unit 340 exists, even when the main power $V_{EXT}$ is reduced below the inverter supply voltage $V_{INV}$, a discharge operation can be continuously performed until a voltage of the backup power unit 340 is reduced below the inverter supply voltage $V_{INV}$.

Except a supply voltage controlled by the control unit 520, an interrupting speed of supply voltages being input to the inside of the chipset depends on a discharge speed with respect to an output unit of the voltage regulators that output supply voltages. Thus, the power supply circuit 500 can control an interrupting order of the supply voltages having a high level in software using the control unit 520 and can control an interrupting order of remaining supply voltages in hardware by controlling a speed of discharging charges that remain in an output unit of the voltage detect unit.

Figure 15:
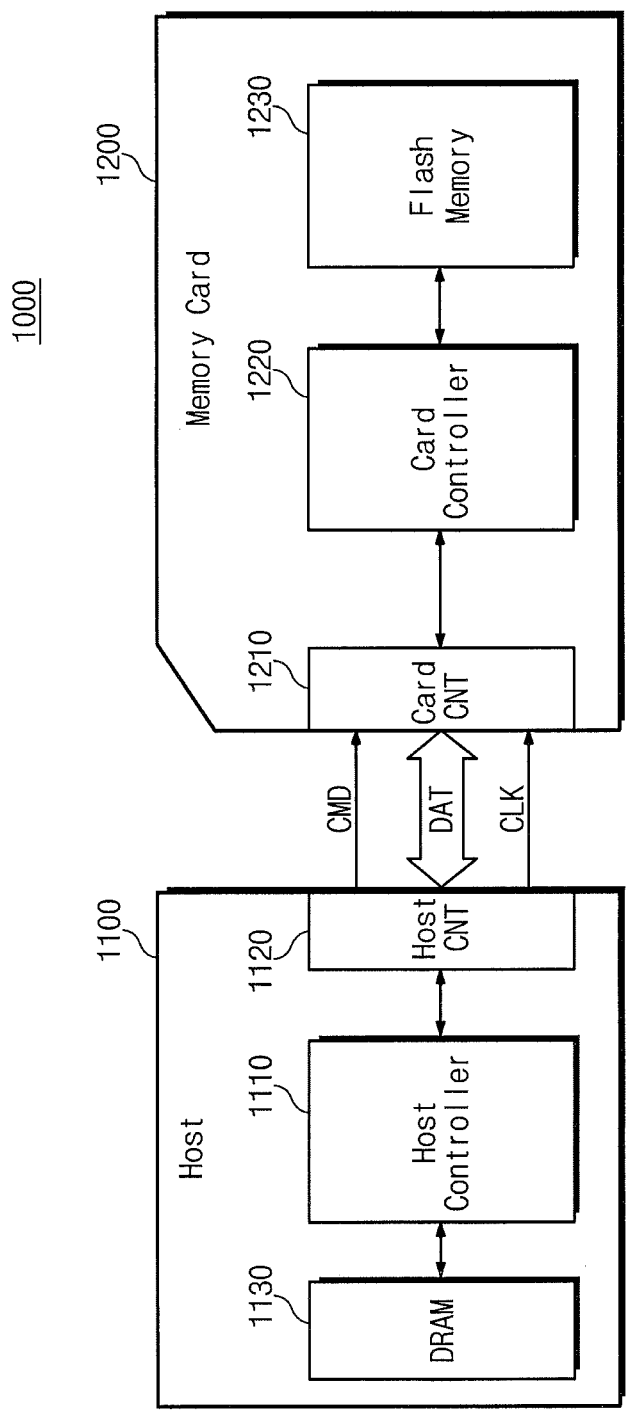
FIG. 15 is a block diagram illustrating a memory card system to which a power supply device in accordance with exemplary embodiments of the inventive is applied.

FIG. 15 is a block diagram illustrating a memory card system to which a power supply device in accordance with exemplary embodiments of the inventive is applied. A memory card system 1000 includes a host 1100 and a memory card 1200. The host 1100 includes a host controller 1110, a host connection unit 1120 and a DRAM 1130.

The host 1100 writes data in the memory card 1200 or reads data stored in the memory card 1200. The host controller 1110 transmits a command (e.g., a write command), a clock signal CLK generated by a clock generator in the host 1100 and data DATA to the memory card 1200 through the host connection unit 1120. The DRAM 1130 is a main memory of the host 1100.

The memory card 1200 includes a card connection unit 1210, a card controller 1220 and a flash memory 1230. The card controller 1220 stores data in the flash memory 1230 in synchronization with a clock signal generated by a clock generator (not shown) in the card controller 1220 in response to a command received through the card connection unit 1210. The flash memory 1230 stores data transmitted from the host 1100. For example, in the case that the host 1100 is a digital camera, the flash memory 1230 stores image data.

The card controller 1220 of the memory card 1200 may include a power supply device for supplying a plurality of supply voltages to the flash memory 1230. The card controller 1220 can control high voltages among supply voltages being supplied to the flash memory 1230 in software and can control remaining supply voltages in hardware. The card controller 1220 can control the order that a supply voltage is supplied to the flash memory 230 and the supply voltage being supplied to the flash memory 230 is interrupted in software and hardware to prevent damage and malfunction of internal elements that may be caused by sudden current supply and sudden current breaking with low complexity.

Figure 16:
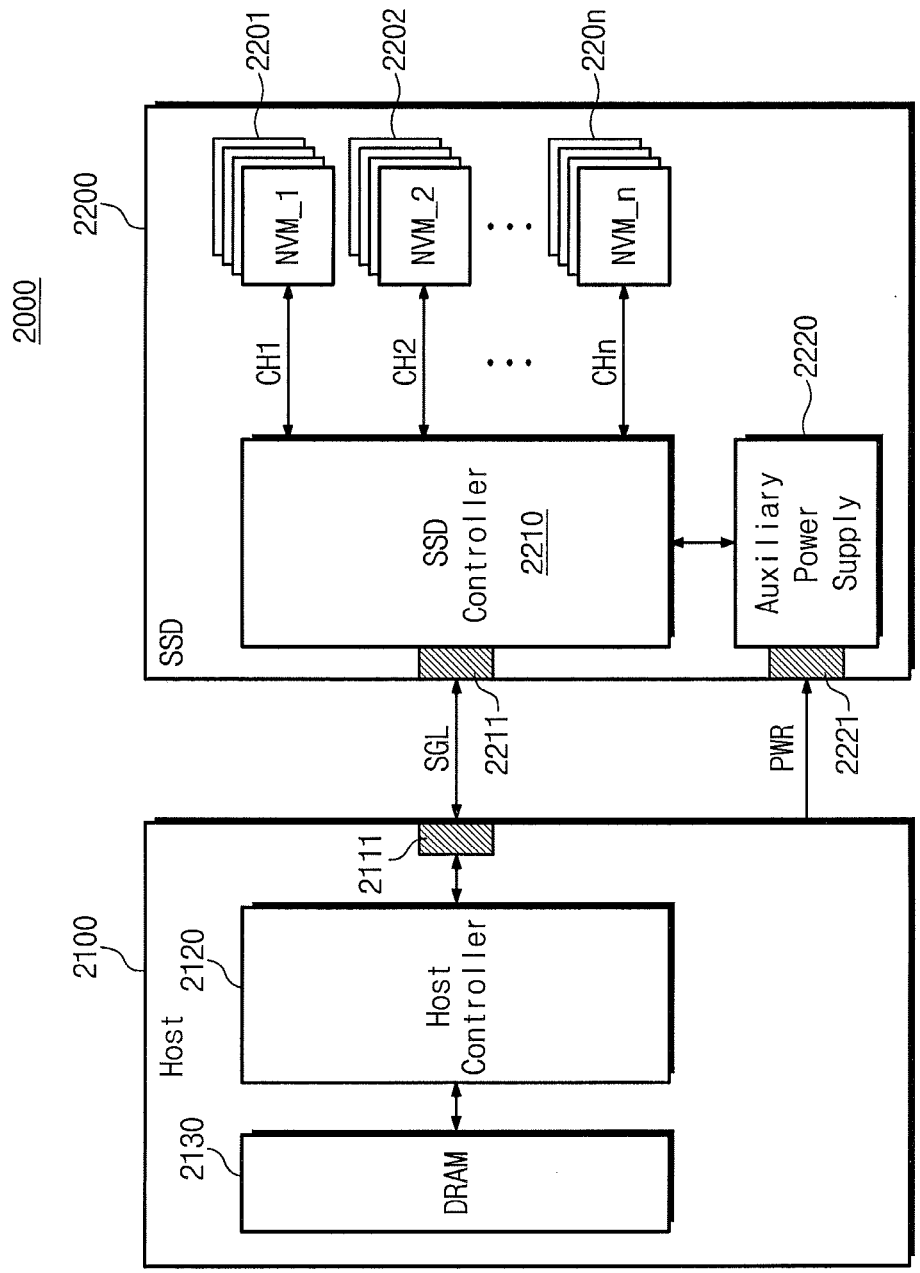
FIG. 16 is a block diagram illustrating a solid state drive (SSD) to which a power supply device in accordance with exemplary embodiments of the inventive is applied.

FIG. 16 is a block diagram illustrating a solid state drive (SSD) to which a power supply device in accordance with exemplary embodiments of the inventive is applied. Referring to FIG. 16, a SSD system 2000 includes a host 2100 and a SSD 2200. The host 2100 includes a host interface 2111, a host controller 2120 and a DRAM 2130.

The host 2100 writes data in the SSD 2200 or reads data stored in the SSD 2200. The host controller 2120 transmits a signal SGL such as a command, an address, a control signal, etc. to the SSD 2200 through the host interface 2111. The DRAM 2130 is a main memory of the host 2100.

The SSD 2200 exchanges a signal SGL with the host 2100 through the host interface 2211 and is inputted with power through a power connector 2221. The SSD 2200 may include a plurality of nonvolatile memories 2201~220*n*, a SSD controller 2210 and an auxiliary power supply 2220. The nonvolatile memories 2201~220*n* can be embodied by a PRAM, a MRAM, an ReRAM, a FRAM, etc. besides a NAND flash memory.

The nonvolatile memories 2201~220*n* are used as a storage medium of the SSD 2200. The nonvolatile memories 2201~220*n* can be connected to a SSD controller 2210 through a plurality of channels CH1~CHn. One or more nonvolatile memories can be connected to one channel. Nonvolatile memories connected to one channel can be connected to a same data bus.

The SSD controller 2210 exchanges a signal SGL with the host 2100 through the host interface 2211. The signal SGL may include a command, an address, data, etc. The SSD controller 2210 writes data in a corresponding nonvolatile memory device or reads data from a corresponding nonvolatile memory device according to a command of the host 2100.

The auxiliary power supply 2220 is connected to the host 2100 through the power connector 2221. The auxiliary power supply 2220 is inputted with power from the host 2100 to be charged. The auxiliary power supply 2220 may be located inside the SSD 2200 or outside the SSD 2200. For example, the auxiliary power supply 2220 can be located on a main board to provide an auxiliary power to the SSD 2200.

The SSD system 2000 can control high voltages among supply voltages being supplied to the nonvolatile memories 2201~220*n* in software and can control remaining supply voltages in hardware. The SSD controller 2210 of the SSD system 2000 can control the order that a supply voltage is supplied to the nonvolatile memories 2201~220*n* and the supply voltage being supplied to the nonvolatile memories 2201~220*n* is interrupted in software and hardware to prevent damage and malfunction of internal elements that may be caused by sudden current supply and sudden current breaking with low complexity.

Figure 17:
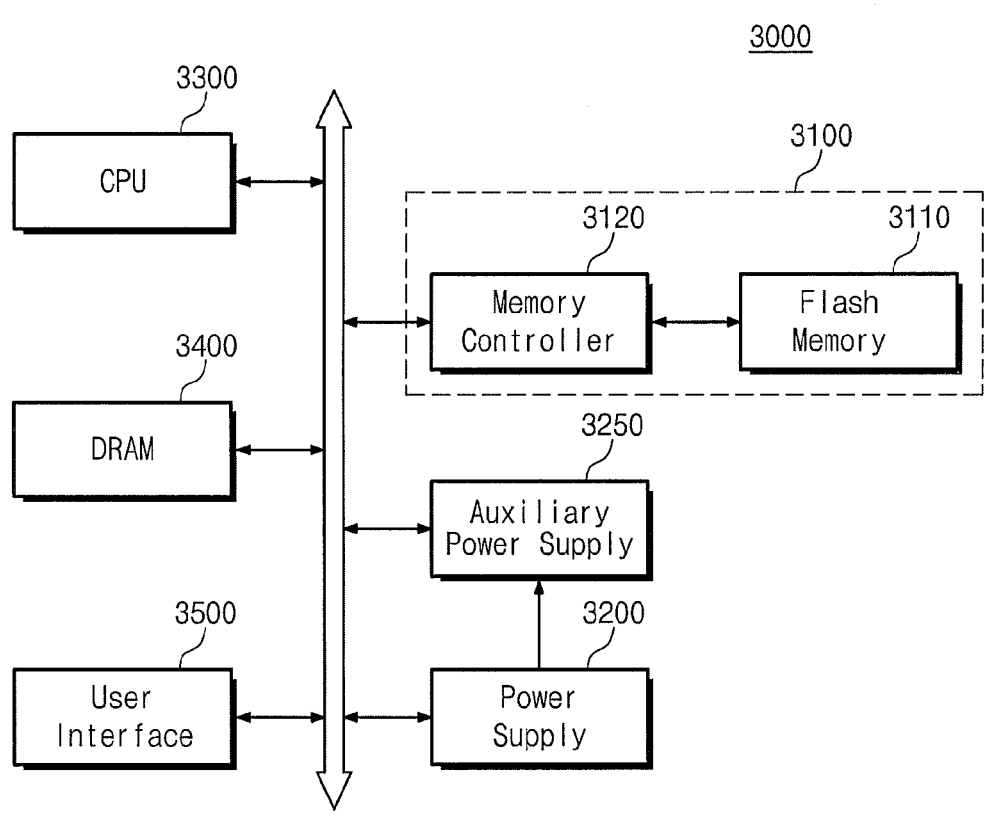
FIG. 17 is a block diagram illustrating a power supply device in accordance with exemplary embodiments of the inventive embodied by an electronic device.

FIG. 17 is a block diagram illustrating a power supply device in accordance with exemplary embodiments of the inventive embodied by an electronic device. An electronic device 3000 may be embodied by a personal computer PC or a portable electronic device such as a notebook computer, a cell phone, a personal digital assistant (PDA), and a camera.

Referring to FIG. 17, the electronic device 3000 includes a memory device 3100, a power supply 3200, an auxiliary power supply 3250, a central processing unit 3300, a DRAM 3400, and a user interface 3500. The memory device 3100 includes a flash memory 3110 and a memory controller 3120. The memory device 3100 can be built in the electronic device 3000.

As described above, the electronic device 3000 can control high voltages among supply voltages being supplied to the flash memory 3110 in software and can control remaining supply voltages in hardware. The memory controller 3120 of the electronic device 3000 can control the order that supply voltages having different levels are supplied to the flash memory 3110 and the supply voltages being supplied to the flash memory 3110 are interrupted in software and hardware to prevent damage and malfunction of internal elements that may be caused by sudden current supply and sudden current breaking with low complexity.

According to the power supply device and the power supply method using the same in accordance with the inventive concept, the order that supply voltages having different levels are supplied can be stably controlled with low cost.

The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. An integrated circuit power supply, comprising:
a first voltage regulating circuit configured to convert an applied power supply signal into a group of first supply voltages provided to an output of the power supply;
a second voltage regulating circuit configured to convert the applied power supply signal into a group of second supply voltages provided to the output of the power supply;
a control circuit configured to selectively enable the second voltage regulating circuit to generate the group of second supply voltages;
an output discharge circuit configured to discharge an output stage of the first voltage regulating circuit in response to a transition of the first voltage regulating circuit from an active state to an inactive state; and
a sequence control circuit configured to generate an enable signal in response to a change in magnitude of the power supply signal,
wherein the first voltage regulating circuit generates the group of first supply voltages in response to the enable signal.

2. The power supply of claim 1, wherein the transition of the first voltage regulating circuit from an active state to an inactive state occurs in response to a change in magnitude of the power supply signal.

3. The power supply of claim 2, further comprising an input discharge circuit configured to discharge an input stage of the first voltage regulating circuit in response to the transition of the first voltage regulating circuit from an active state to an inactive state.

4. The power supply of claim 1, further comprising a backup power supply circuit configured to store energy derived from the applied power supply signal and provide the stored energy as power to the output discharge circuit.

5. A power supply device for supplying power to a chipset of a semiconductor device comprising:
a pre-control voltage regulate unit configured to convert main power into a pre-control supply voltage group including at least one pre-control supply voltage and to provide the pre-control supply voltage group to the chipset in response to the main power;
a post-control voltage regulate unit configured to convert the main power into a post-control supply voltage group including at least one post-control supply voltage and to provide the post-control supply voltage group to the chipset in response to the main power;

a control unit configured to provide a command which activates the post-control supply voltage group to the chipset so that the chipset uses the post-control voltage supply group; and an output discharge unit configured to discharge remaining charges at an output stage of the pre-control voltage regulate unit when the pre-control voltage regulate unit is in an inactivate state in response to a level of the main power.

6. The power supply device of claim 5, further comprising a sequence control unit configured to receive the main power to generate an enable signal, wherein the pre-control voltage regulate unit provides the pre-control supply voltage group to the chipset in response to the enable signal.

7. The power supply device of claim 6, wherein the sequence control unit comprises:

a voltage detect unit configured to output a signal when a voltage level of the main power reaches a pre-designated level; and a delay unit configured to delay the output signal output from the voltage detect unit, wherein the voltage detect unit comprises:

a first voltage detector configured to output a first signal when a voltage level of the main power reaches a first detecting level; and a second voltage detector configured to output a second signal when a voltage level of the main power reaches a second detecting level, wherein the delay unit comprises:

a first delayer connected to the first voltage detector to delay the first signal for a first delay time; and a second delayer connected to the second voltage detector to delay the second signal for a second delay time, and wherein the delayed first signal is output as a first enable signal and the delayed second signal is output as a second enable signal.

8. The power supply device of claim 7, wherein the first delayer outputs a low level signal without delay of the first signal if the first signal has a low level, and wherein the second delayer outputs a low level signal without delay of the second signal if the second signal has a low level.

9. The power supply device of claim 7, wherein the pre-control voltage regulate unit comprises:

a first voltage regulator configured to convert the main power into a first supply voltage according to the first enable signal; and a second voltage regulator configured to convert the main power into a second supply voltage according to the second enable signal, wherein an enforced discharge unit comprises:

a first enforced discharger configured to discharge remaining charges in the first voltage regulator according to the first inverting signal; and a second enforced discharger configured to discharge remaining charges in the second voltage regulator according to the second inverting signal, and wherein the first inverting signal is an inverted signal of the first enable signal and the second inverting signal is an inverted signal of the second enable signal.

10. The power supply device of claim 6, further comprising a discharge control unit configured to receive the enable signal to generate a discharge signal indicating an operation state of the pre-control voltage regulate unit, wherein the output discharge unit discharges remaining charges at an output stage of the pre-control voltage regulate unit according to the discharge signal when the pre-control voltage regulate unit is in an inactivated state.

11. The power supply device of claim 6, further comprising an input discharge unit configured to discharge remaining charges at an input stage of the pre-control voltage regulate unit according to the discharge signal when the pre-control voltage regulate unit is in an inactivated state.

12. The power supply device of claim 10, further comprising a backup power unit configured to store power from the main power and to provide the stored power to the discharge control unit and the output discharge unit.

13. The power supply device of claim 5, wherein the control unit generates a reset signal for resetting the chipset, provides the reset signal to the chipset, and then provides the command to the chipset.

14. The power supply device of claim 13, further comprising a memory configured to load firmware booting the semiconductor device, wherein the control unit executes firmware loaded in the memory and provides the command to the chipset in the process of booting.

15. The power supply device of claim 5, wherein the output discharge unit comprises:

a load connected to the pre-control voltage control unit; and a switch connected to the load to turn on-off according the discharge signal, wherein the quantity of discharge currents is variable according to a size of the load.

16. The power supply device of claim 5, wherein the command is provided as a form of a set feature command.

17. A method for supplying power to a chipset of a semiconductor device comprising:

applying a main power to a power supply device;

converting the main power into at least one pre-control supply voltage and at least one post-control supply voltage and providing the at least one post-control supply voltage to the chipset;

discharging remaining charges of the power supply device for a pre-designated delay time;

providing the at least one pre-control supply voltage to the chipset after the delay time has passed; and activating the at least one post-control supply voltage in the chipset in response to a command provided from the power supply device.

18. The method of supplying power of claim 17, further comprising resetting the chipset, wherein the activating the at least one post-control supply voltage in the chipset in response to a command provided from the power supply device is activating the at least one post-control supply voltage in the chipset in response to a command provided from the power supply device after the chipset is reset.

19. A method for supplying pre-control and post-control supply voltages to a chipset of a semiconductor device using a power supply device comprising:

storing preliminary power from main power;

interrupting the main power from the power supply device;

dumping data being used in the power supply device using the preliminary power as an operating voltage;

providing a command inactivating the post-control supply voltage to the chipset;

stopping an output of the pre-control supply voltage from the power supply device in response to a level reduction of the preliminary power; and discharging remaining charges of the power supply device using the preliminary power as an operating voltage.

* * * * *